US012677704B2

(12) United States Patent
Hung et al.

(10) Patent No.: US 12,677,704 B2
(45) Date of Patent: Jul. 7, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Wensen Hung, Zhubei City (TW); Tsung-Yu Chen, Hsinchu (TW); Wen-Hsin Wei, Hsinchu (TW); Hsien-Pin Hu, Zhubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 582 days.

(21) Appl. No.: 18/149,793

(22) Filed: Jan. 4, 2023

(65) Prior Publication Data

US 2024/0088093 A1     Mar. 14, 2024

Related U.S. Application Data

(60) Provisional application No. 63/406,031, filed on Sep. 13, 2022.

(51) Int. Cl.
| | |
|---|---|
| *H10W 90/00* | (2026.01) |
| *H10W 40/47* | (2026.01) |
| *H10W 70/685* | (2026.01) |
| *H10W 74/01* | (2026.01) |
| *H10W 74/10* | (2026.01) |
| *H10W 72/90* | (2026.01) |

(Continued)

(52) U.S. Cl.
CPC ........... *H10W 90/00* (2026.01); *H10W 40/47* (2026.01); *H10W 70/685* (2026.01); *H10W 74/01* (2026.01); *H10W 74/111* (2026.01);

*H10W 90/701* (2026.01); *H10W 72/9415* (2026.01); *H10W 74/00* (2026.01); *H10W 76/60* (2026.01); *H10W 80/743* (2026.01); *H10W 90/724* (2026.01)

(58) Field of Classification Search
None
See application file for complete search history.

(56) References Cited

U.S. PATENT DOCUMENTS 9,349,681 B1 * 5/2016 Kelly ....................... H01L 25/16
9,478,504 B1 * 10/2016 Shen ................. H01L 23/49838
(Continued)

FOREIGN PATENT DOCUMENTS

| CN | 212645462 U | 3/2021 |
|---|---|---|
| TW | I705537 B | 9/2020 |
| TW | I776693 B | 9/2022 |

*Primary Examiner* — Nicholas J Tobergte
(74) *Attorney, Agent, or Firm* — Slater Matsil, LLP

(57) ABSTRACT

In an embodiment, a method includes: attaching a package component to a package substrate, the package component includes: a first die being disposed over an interposer; a second die being disposed over the interposer and laterally adjacent to the first die; and an encapsulant being disposed around the first die and the second die; attaching a thermal interface material to the first die and the second die; and attaching a lid structure to the package substrate, the lid structure includes: a lid cap being disposed over the thermal interface material; and a plurality of lid feet connecting the lid cap to the package substrate, in a plan view the plurality of lid feet forming a discontinuous loop around the package component.

20 Claims, 36 Drawing Sheets

(51) Int. Cl.
| | |
|---|---|
| *H10W 74/00* | (2026.01) |
| *H10W 76/60* | (2026.01) |
| *H10W 80/00* | (2026.01) |

(56)                    References Cited

U.S. PATENT DOCUMENTS

| | | | |
|---|---|---|---|
| 10,515,869 B1 | 12/2019 | Yeh et al. | |
| 2002/0172022 A1* | 11/2002 | DiBene, II | H01R 12/7088 257/E23.09 |
| 2010/0157539 A1* | 6/2010 | Wang | H01L 23/4093 361/709 |
| 2018/0350755 A1* | 12/2018 | Huang | H01L 23/3128 |
| 2018/0374776 A1* | 12/2018 | Liu | H01L 23/3737 |
| 2021/0035881 A1 | 2/2021 | Mallik et al. | |
| 2021/0242098 A1* | 8/2021 | Sinha | H01L 21/52 |
| 2022/0216123 A1 | 7/2022 | Wang et al. | |
| 2022/0352045 A1 | 11/2022 | Lin et al. | |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/406,031, filed on Sep. 13, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a tendency for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
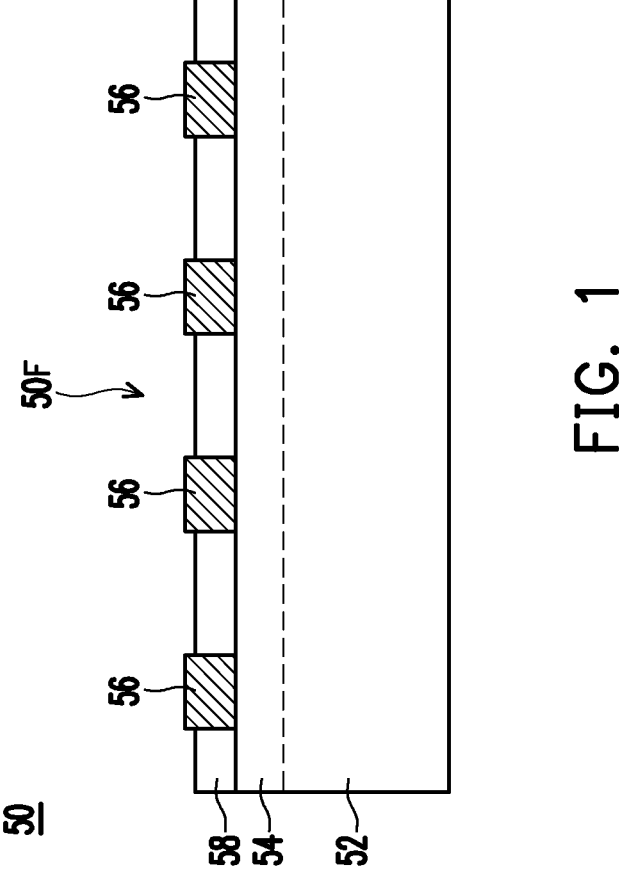
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by packaging integrated circuit dies over a wafer (e.g., an interposer). The integrated circuit dies may include a combination of, e.g., logic, memory, and input/output devices. Encapsulant is formed over the wafer and around the integrated circuit dies. The wafer is singulated to form package components, and one or more of the package components are then attached to package substrates to form partial semiconductor packages. A heat transfer structure, including one or more thermal interface materials (TIMs) and a lid structure, is attached to the partial semiconductor packages to form the integrated circuit packages. In some embodiments, the heat transfer structure is formed by attaching the TIMs (e.g., a material with high thermal conductivity) to the first integrated circuit dies of the package components. The lid structure is attached to the package substrate and to the TIMs. The lid structure includes features designed to improve performance. For example, the lid structure may include features such as lid feet attached to the package substrate and a lid cap bridging the lid feet and attached to the TIMs. The heat transfer structure (e.g., the TIMs and the lid structure) advantageously dissipates heat from the integrated circuit dies with improved efficiency. For example, features relating to flexibility in the lid structure ensure the lid cap maintains full thermal contact with the underlying TIMs with reduced stress even when various processing steps (e.g., thermal processes) may cause warpage to the integrated circuit package. In addition, features relating to structural integrity of the lid structure help the integrated circuit package avoid or reduce warpage during those various processing steps.

FIG. 1 is a cross-sectional view of an integrated circuit die 50. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like. In an embodiment the die connectors 56 may be microbumps, ball grid array (BGA) connectors, solder balls, metal pillars, controlled collapse chip connection (C4) bumps, electroless nickel-electroless palladium-immersion gold technique (ENEPIG) formed bumps, or the like. The die connectors 56 may include a conductive material such as solder, copper, aluminum, gold, nickel, silver, palladium, tin, the like, or a combination thereof. In some embodiments, the die connectors 56 are formed by initially forming a layer of solder through evaporation, electroplating, printing, solder transfer, ball placement, or the like. Once a layer of solder has been formed on the structure, a reflow may be performed in order to shape the material into the desired bump shapes.

Optionally, solder regions (not separately illustrated) may be disposed on the die connectors 56 during formation of the integrated circuit die 50. The solder regions may be used to perform chip probe testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. The dielectric layer 58 may be patterned to form openings, and the die connectors 56 may be formed in the openings. Portions of the die connectors 56 may be disposed over the dielectric layer 58 or protrude above the dielectric layer 58. In some embodiments, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. In some embodiments (not specifically illustrated), after the planarization process, top surfaces of the die connectors 56 and the dielectric layer 58 are substantially coplanar (within process variations) such that they are level with one another. The die connectors 56 and the dielectric layer 58 are exposed at the front-side 50F of the integrated circuit die 50.

In some embodiments (not specifically illustrated), the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through vias, such as through-substrate vias (TSVs) (e.g., through-silicon vias). Each of the semiconductor substrates 52 may (or may not) have a separate interconnect structure 54.

FIGS. 2-8E are views of intermediate stages in the manufacturing of integrated circuit packages 100, in accordance with some embodiments. FIGS. 2-5C are cross-sectional views of a process for forming package components 150 (e.g., which include integrated circuit dies 50 attached to interposers 102), such as chip-on-wafer (CoW) devices. FIGS. 6A-6C are cross-sectional views of attaching the package components 150 to package substrates 202 to form the integrated circuit packages 100, such as chip-on-wafer-on-substrate (CoWoS™) devices. FIGS. 7A-8E are cross-sectional views of attaching a heat transfer structure (e.g., including a TIM 80 and a lid structure 320) to the package component 150 and the package substrate 202.

Figure 2:
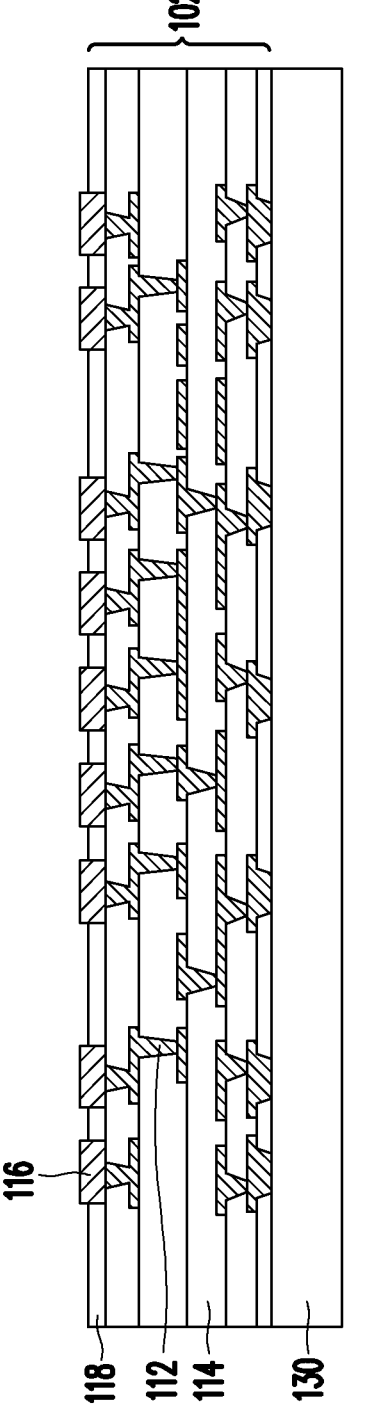
FIGS. 2-8E are views of intermediate stages in the manufacturing of integrated circuit packages, in accordance with some embodiments.

In FIG. 2, the interposer 102 is formed over a carrier wafer 130. For example, the interposer 102 may include a plurality of metallization layers 112 embedded in a plurality of dielectric layers 114. Acceptable dielectric materials for the dielectric layers 114 include a polymer such as polybenzoxazole (PBO), polyimide, a benzocyclobuten (BCB) based polymer, or the like. Other dielectric materials may also be used, including oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. The metallization layers 112 may include conductive lines and conductive vias connecting levels of conductive lines to one another. The metallization layers 112 may be formed of a conductive material, such as a metal, such as copper, cobalt, aluminum, gold, combinations thereof, or the like.

As an example to form the interposer 102 in this embodiment, a first of the dielectric layers 114 is formed over the carrier wafer 130. In some embodiments, the carrier wafer 130 is a substrate such as a bulk semiconductor or a glass substrate. In some embodiments, the interposer 102 may be formed over an adhesive layer (not specifically illustrated) on the carrier wafer 130, which may be a laser- and/or thermal-release material which loses its adhesive property when exposed to certain wavelengths of light and/or heated. For example, the adhesive layer may be a light-to-heat-conversion (LTHC) release coating comprising an epoxy, a polyimide, an acrylic, or the like, and may be in an acetate and/or alcohol solvent, for example, or a suitable material.

Openings are formed in the first of the dielectric layers 114, and a seed layer (not specifically illustrated) is formed over the first of the dielectric layers 114 and in the openings over the exposed surfaces of the carrier wafer 130. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to a first of the metallization layers 112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the first of the metallization layers 112. These steps may be repeated to form a second of the dielectric layers 114, a second of the metallization layers 112, and so on until all of the metallization layers 112 and the dielectric layers 114 of the interposer 102 are formed. In some embodiments (not specifically illustrated), the interposer 102 (e.g., the metallization layers 112 and the dielectric layers 114) may be formed by damascene processes, such as a single damascene process, a dual damascene process, the like, or combinations thereof.

In some embodiments, die connectors 116 and a dielectric layer 118 are formed over the metallization layers 112 and the dielectric layers 114. Specifically, the interposer 102 may include die connectors 116 and a dielectric layer 118 that are similar to the die connectors 56 and the dielectric layer 58 of the integrated circuit die 50 described for FIG. 1. For example, the die connectors 116 may be considered part of an upper metallization layer 112 of the interposer 102.

Figure 3A:
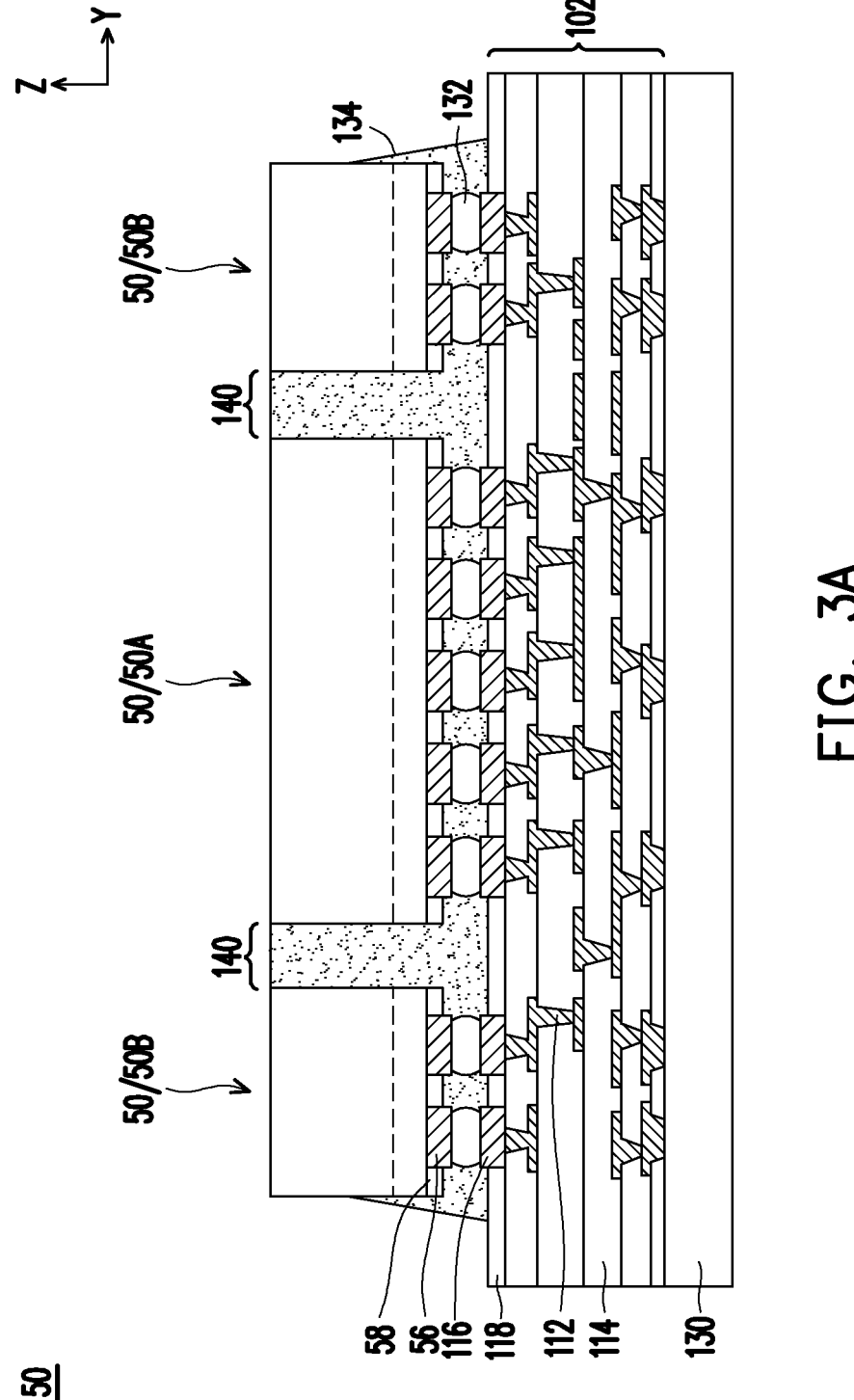
Figure 3B:
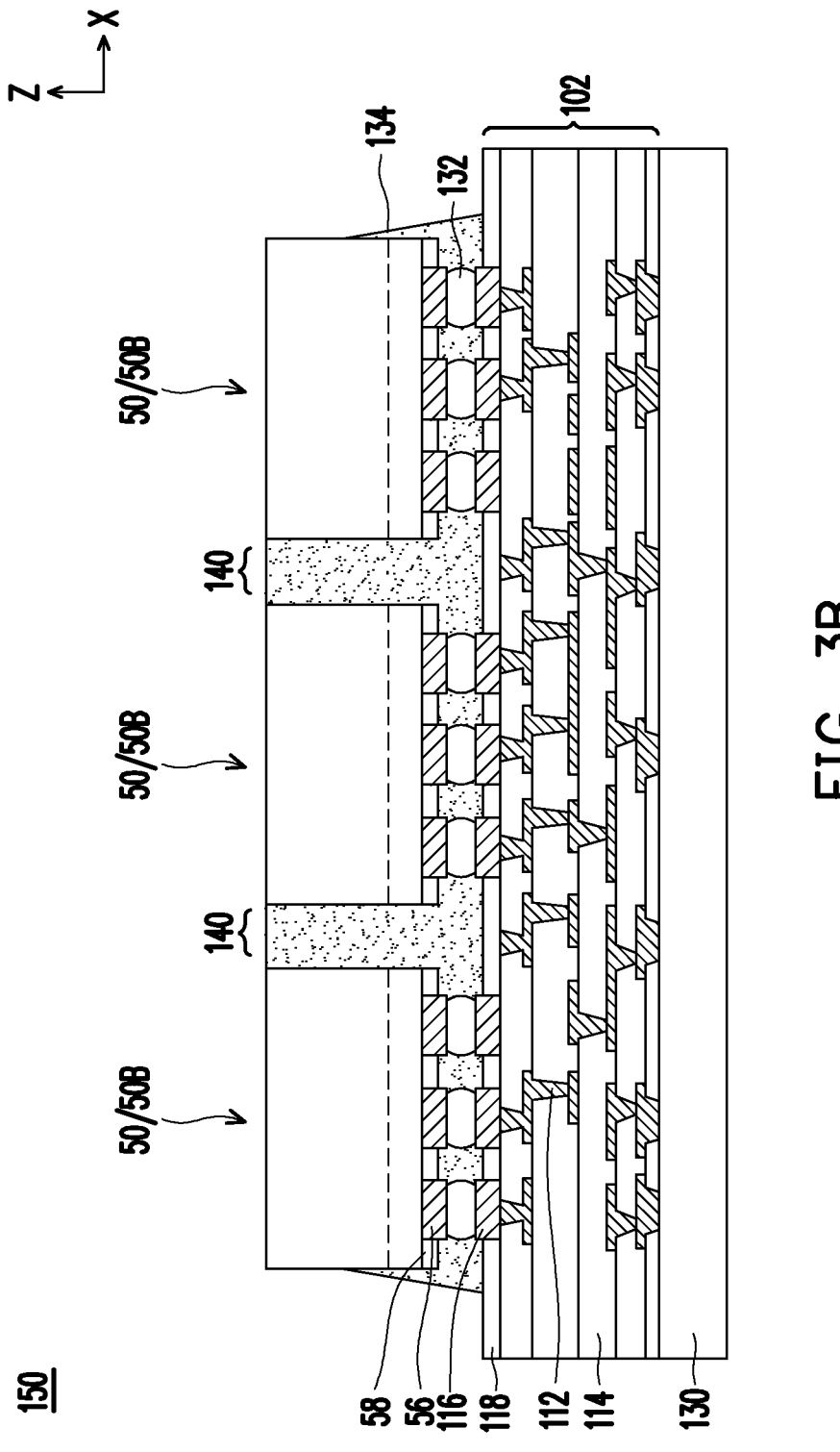
Figure 3C:
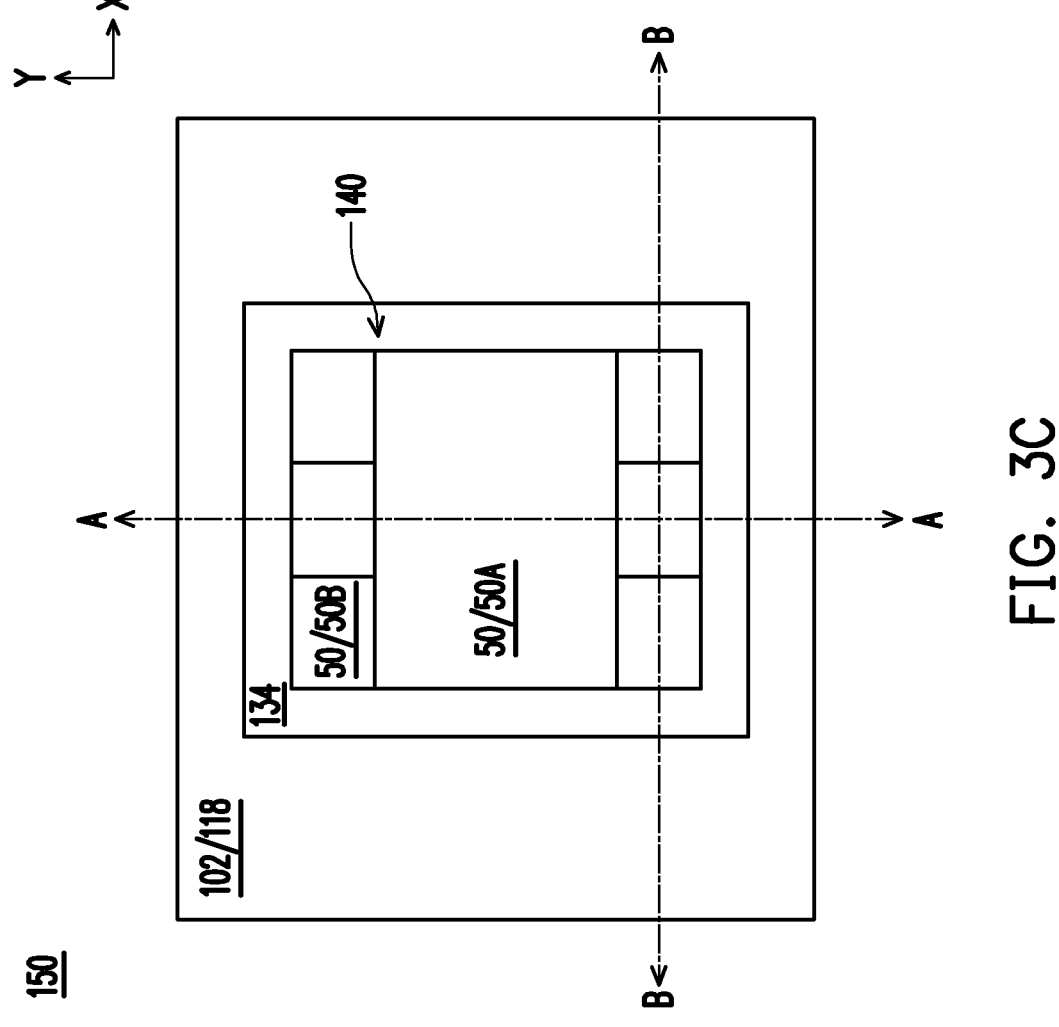

In FIGS. 3A-3C, integrated circuit dies 50 (e.g., one or more of first integrated circuit dies 50A and one or more of second integrated circuit dies 50B) are attached to the interposer 102. FIGS. 3A-3B illustrate side views of the package component 150, and FIG. 3C illustrates a plan view (e.g., X-Y plane) of the package component 150, in accordance with some embodiments. In particular, FIG. 3A illustrates the A-A cross-section (e.g., Y-Z plane) of FIG. 3C, and FIG. 3B illustrates the B-B cross-section (e.g., X-Z plane) of FIG. 3C. For simplicity, note that the package component 150 of FIG. 3C is illustrated without distinguishing gap regions 140 between the integrated circuit dies 50. Subsequent plan views may be simplified in similar ways, unless otherwise stated.

In the embodiments shown, multiple integrated circuit dies 50 are placed adjacent one another, wherein the first integrated circuit die 50A is between the second integrated circuit dies 50B. In some embodiments, the first integrated circuit die 50A is a logic device (e.g., SoC device), such as a CPU, GPU, or the like, and the second integrated circuit dies 50B are input/output (I/O) devices and/or memory devices, such as DRAM dies, HMC modules, HBM modules, or the like. Although one of the first integrated circuit dies 50A and six of the second integrated circuit dies 50B are illustrated in a particular layout, it should be appreciated that any number of each type of the integrated circuit dies 50 in any suitable layout may be attached to the interposer 102 to form the package components 150.

In the illustrated embodiment, the integrated circuit dies 50 are attached to the interposer 102 with conductive connectors 132, such as solder bonds. The conductive connectors 132 may be formed of a conductive material that is reflowable, such as solder, copper, aluminum, gold, nickel, silver, palladium, tin, the like, or a combination thereof. In some embodiments, the conductive connectors 132 are formed by initially forming a layer of solder through methods such as evaporation, electroplating, printing, solder transfer, ball placement, or the like on the die connectors 116. Once a layer of solder has been formed on the die connectors 116, a reflow may be performed in order to shape the conductive connectors 132 into desired bump shapes. Attaching the integrated circuit dies 50 to the interposer 102 may include using, for example, a pick and place tool to place the integrated circuit dies 50 on the interposer 102 and reflowing the conductive connectors 132. The conductive connectors 132 form joints between corresponding die connectors 116 of the interposer 102 and die connectors 56 of the integrated circuit dies 50, electrically connecting the interposer 102 to the integrated circuit dies 50.

An underfill 134 may be formed around the conductive connectors 132, and between the interposer 102 and the integrated circuit dies 50. The underfill 134 may reduce stress and protect the joints resulting from the reflowing of the conductive connectors 132. The underfill 134 may be formed of an underfill material such as a molding compound, epoxy, or the like. The underfill 134 may be formed by a capillary flow process after the integrated circuit dies 50 are attached to the interposer 102, or may be formed by a suitable deposition method after the integrated circuit dies 50 are attached to the interposer 102. The underfill 134 may be applied in liquid or semi-liquid form and then subsequently cured.

In other embodiments (not specifically illustrated), the integrated circuit dies 50 are attached to the interposer 102 with direct bonds. For example, fusion bonding, dielectric bonding, metal bonding, combinations thereof (e.g., dielectric-to-dielectric bonding and metal-to-metal bonding), or the like may be used to directly bond corresponding dielectric layers 58, 118 and/or corresponding die connectors 56, 116 without the use of adhesive or solder. The underfill 134 may be omitted when direct bonding is used. Further, a mix of bonding techniques could be used, e.g., some integrated circuit dies 50 could be attached to the interposer 102 by solder bonds (e.g., the conductive connectors 132), and other integrated circuit dies 50 could be attached to the interposer 102 by direct bonds.

Figure 4A:
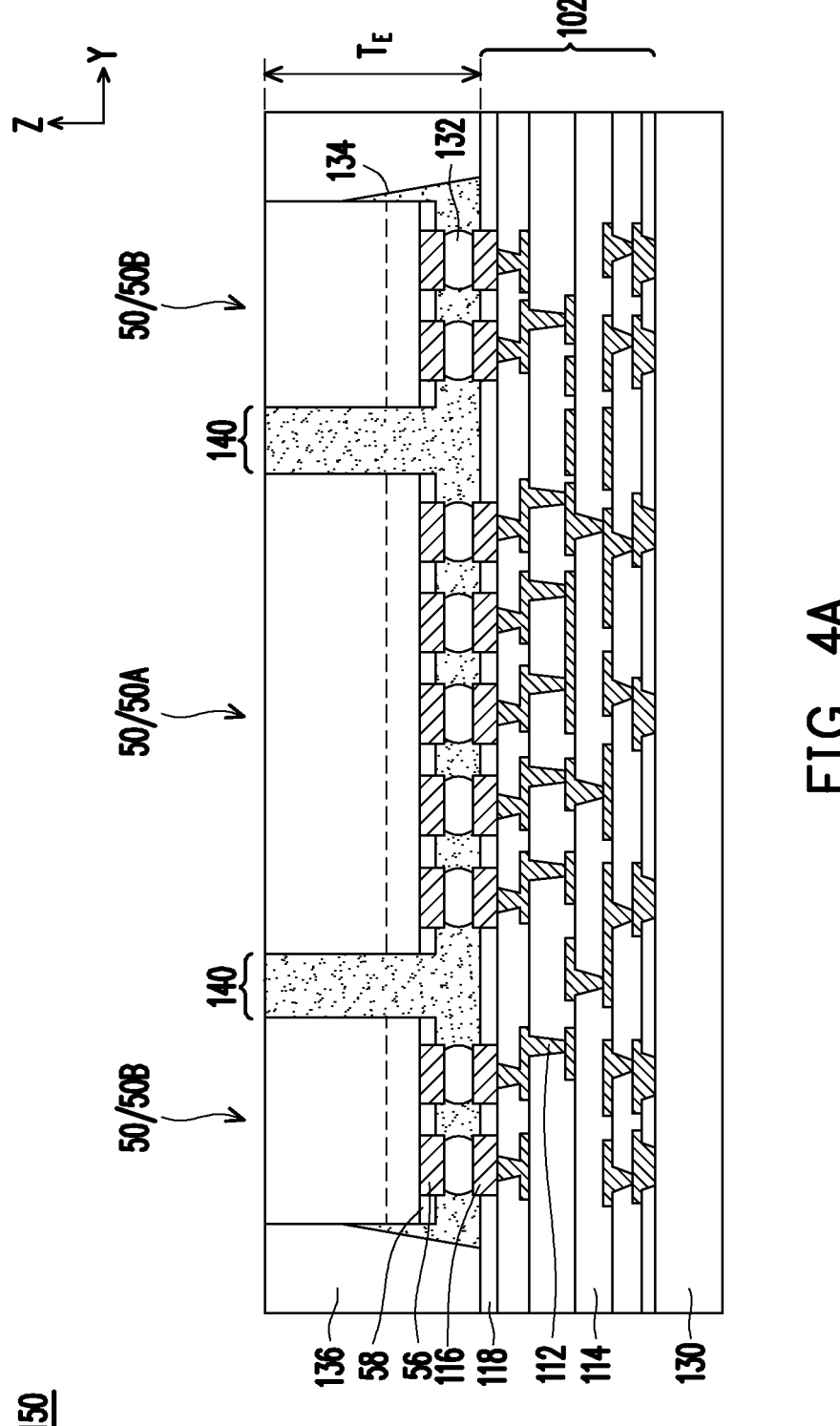
Figure 4B:
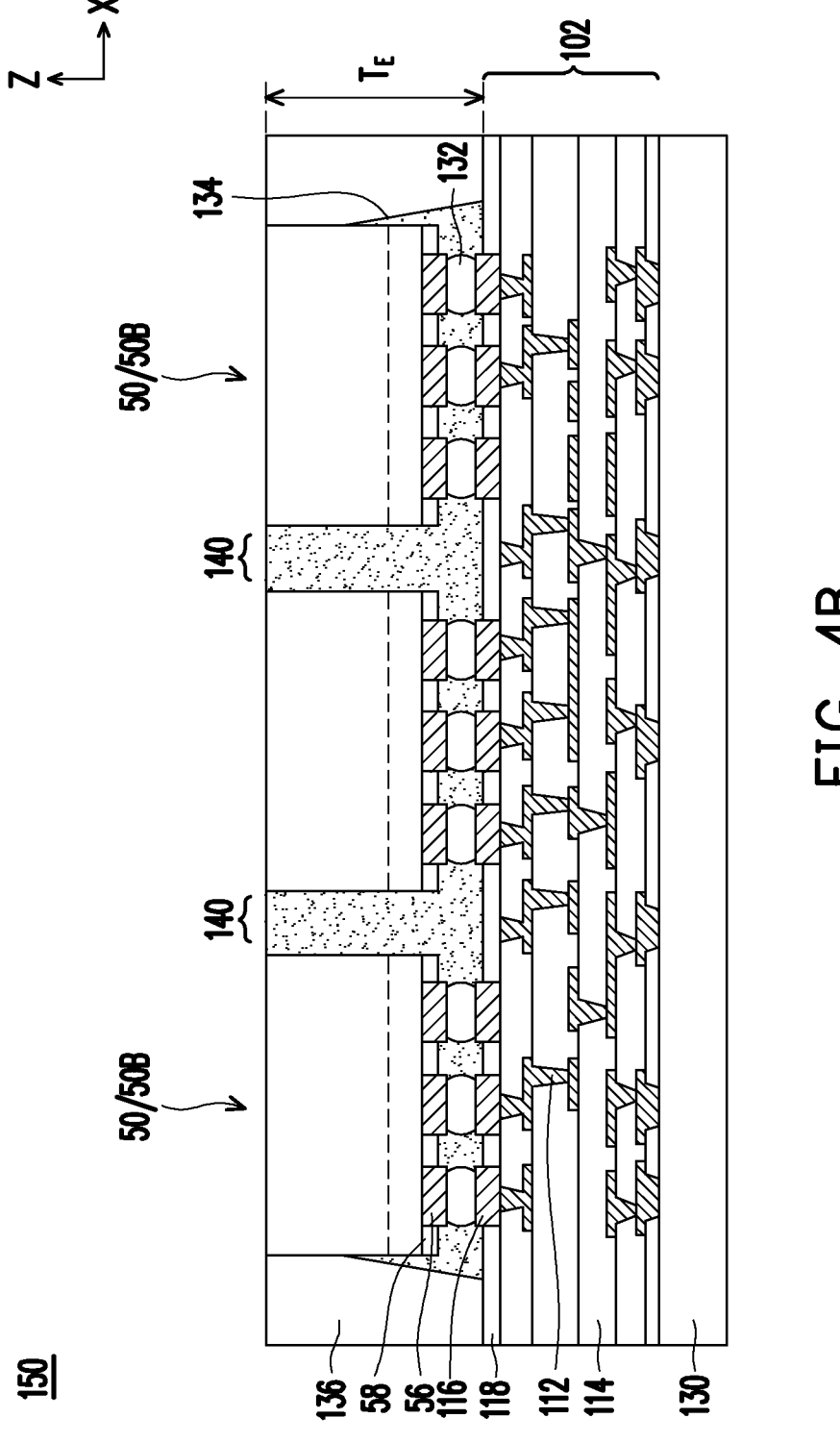
Figure 4C:
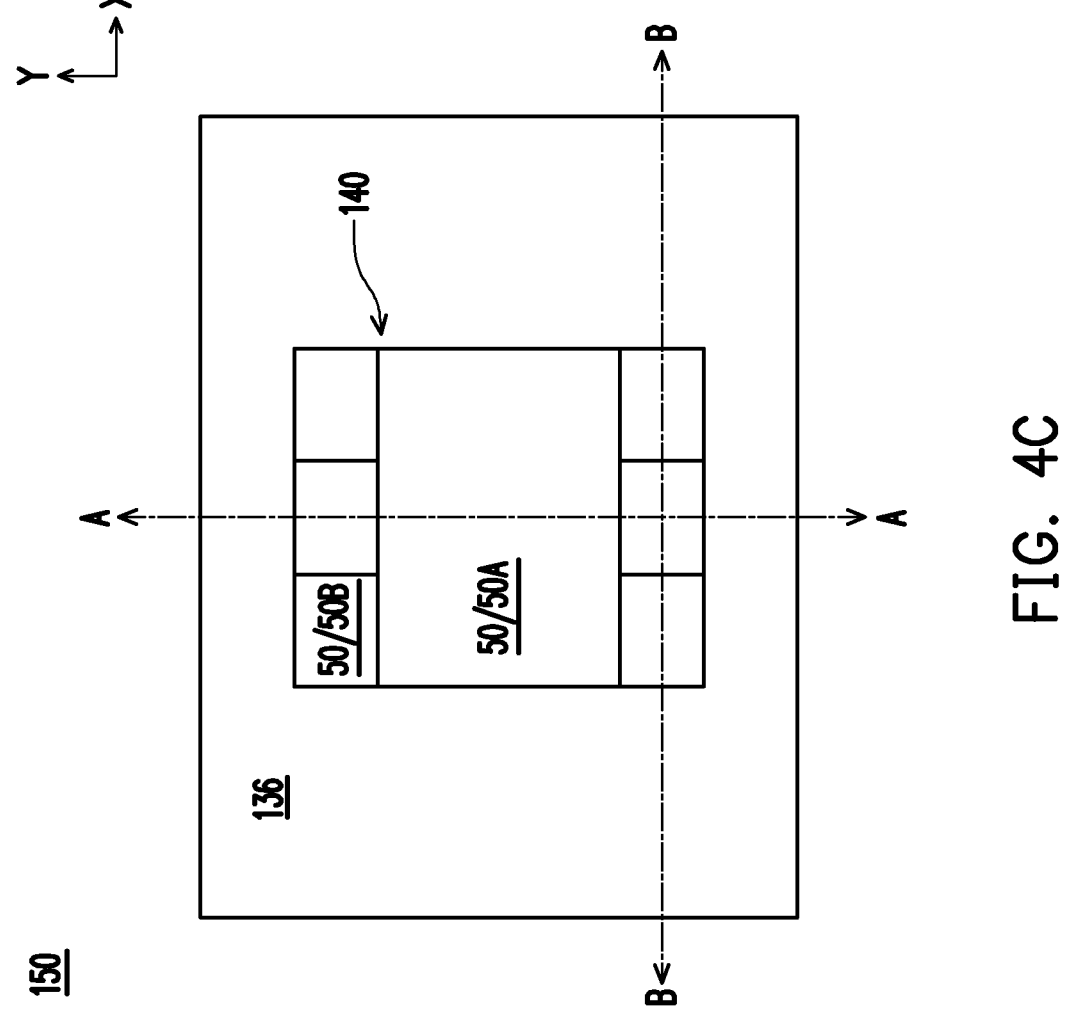

In FIGS. 4A-4C, an encapsulant 136 is formed over the interposer 102 and on and around the integrated circuit dies 50. FIGS. 4A-4B illustrate side views of the package component 150, and FIG. 4C illustrates a plan view (e.g., the X-Y plane) of the package component 150, in accordance with some embodiments. In particular, FIG. 4A illustrates the A-A cross-section (e.g., the Y-Z plane) of FIG. 4C, and FIG. 4B illustrates the B-B cross-section (e.g., the X-Z plane) of FIG. 4C.

After formation, the encapsulant 136 encapsulates the integrated circuit dies 50 as well as the underfill 134 (if present) or the conductive connectors 132. The encapsulant 136 may be a molding compound, epoxy, or the like. The encapsulant 136 may be applied by compression molding, transfer molding, or the like, and is formed over the interposer 102 such that the integrated circuit dies 50 are buried or covered. The encapsulant 136 may be applied in liquid or semi-liquid form and then subsequently cured. The encapsulant 136 may be thinned to expose the integrated circuit dies 50. The thinning process may be a grinding process, a chemical-mechanical polish (CMP), an etch-back, combinations thereof, or the like. After the thinning process, the top surfaces of the integrated circuit dies 50 and the encapsulant 136 are coplanar (within process variations) such that they are level with one another. The thinning is performed until a desired amount of the integrated circuit dies 50 and/or the encapsulant 136 has been removed. For example, the encapsulant 136 may have a thickness $T_E$ above the interposer 102, and a height of the integrated circuit dies 50 above the interposer 102 may be the same as the thickness $T_E$ of the encapsulant 136.

Note that although the underfill 134 is illustrated as being formed between each of the integrated circuit dies 50 and having top surfaces that are level with the integrated circuit dies 50 and the encapsulant 136, the underfill 134 may only partially fill the gaps between the integrated circuit dies 50. As such, in some embodiments (not specifically illustrated), the encapsulant 136 is also formed at least partially between the integrated circuit dies 50, and the encapsulant 136 in those regions may be level with the integrated circuit dies 50 and with other portions of the encapsulant 136 disposed around the outermost sidewalls (e.g., perimeter) of the integrated circuit dies 50 (e.g., the level top surfaces having a height above the interposer 102 being the thickness $T_E$).

Figure 5A:
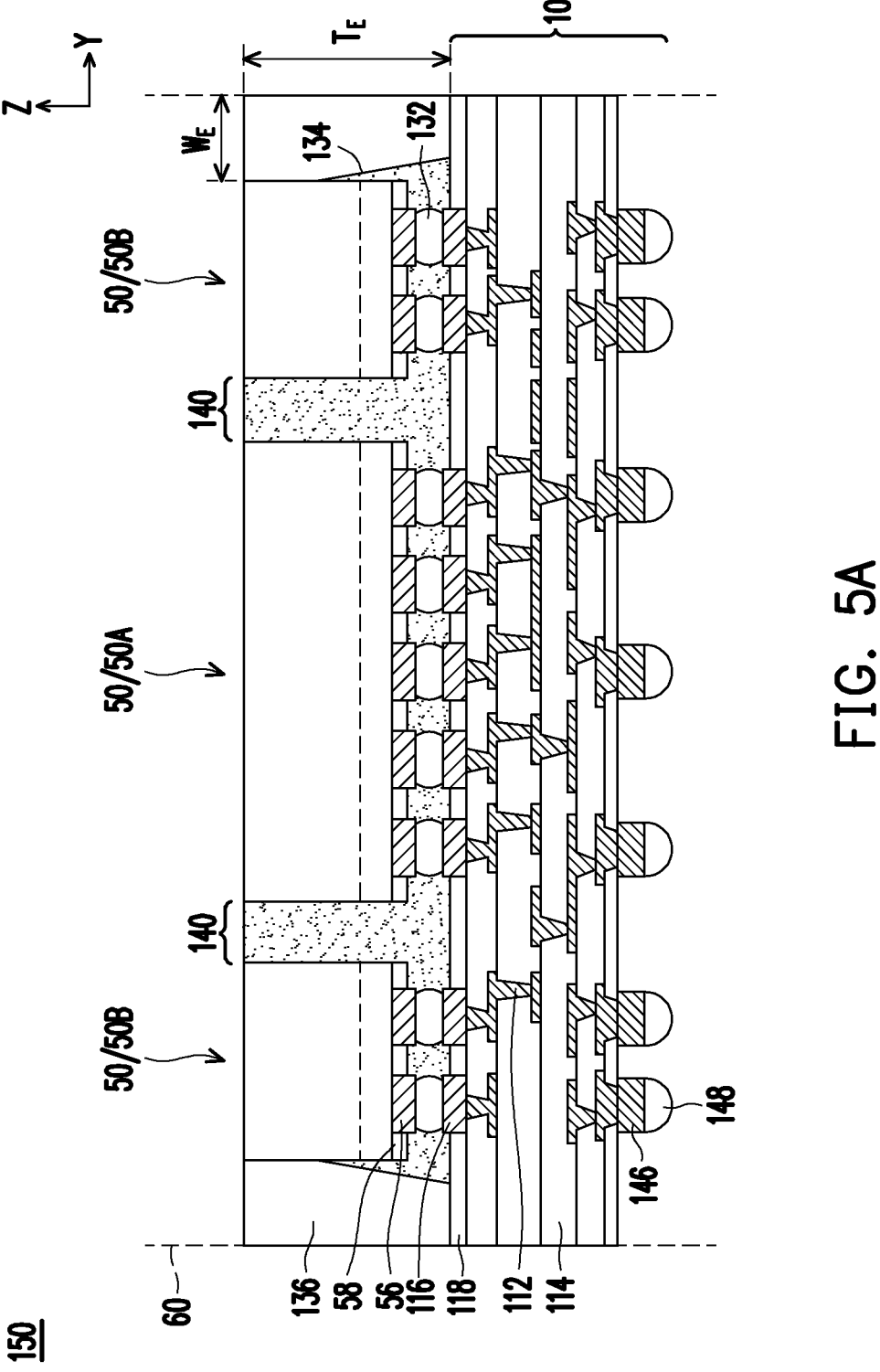
Figure 5B:
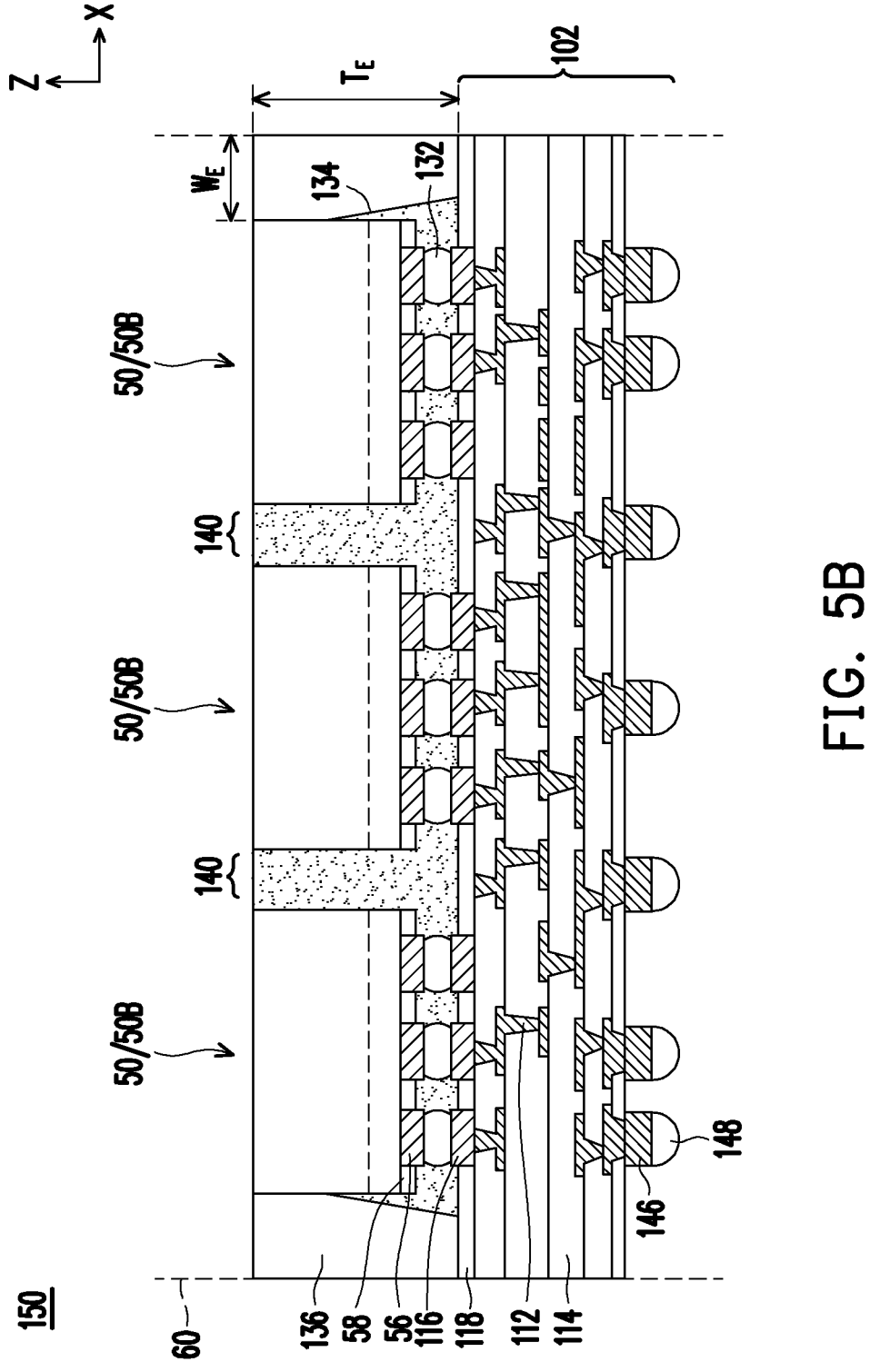
Figure 5C:
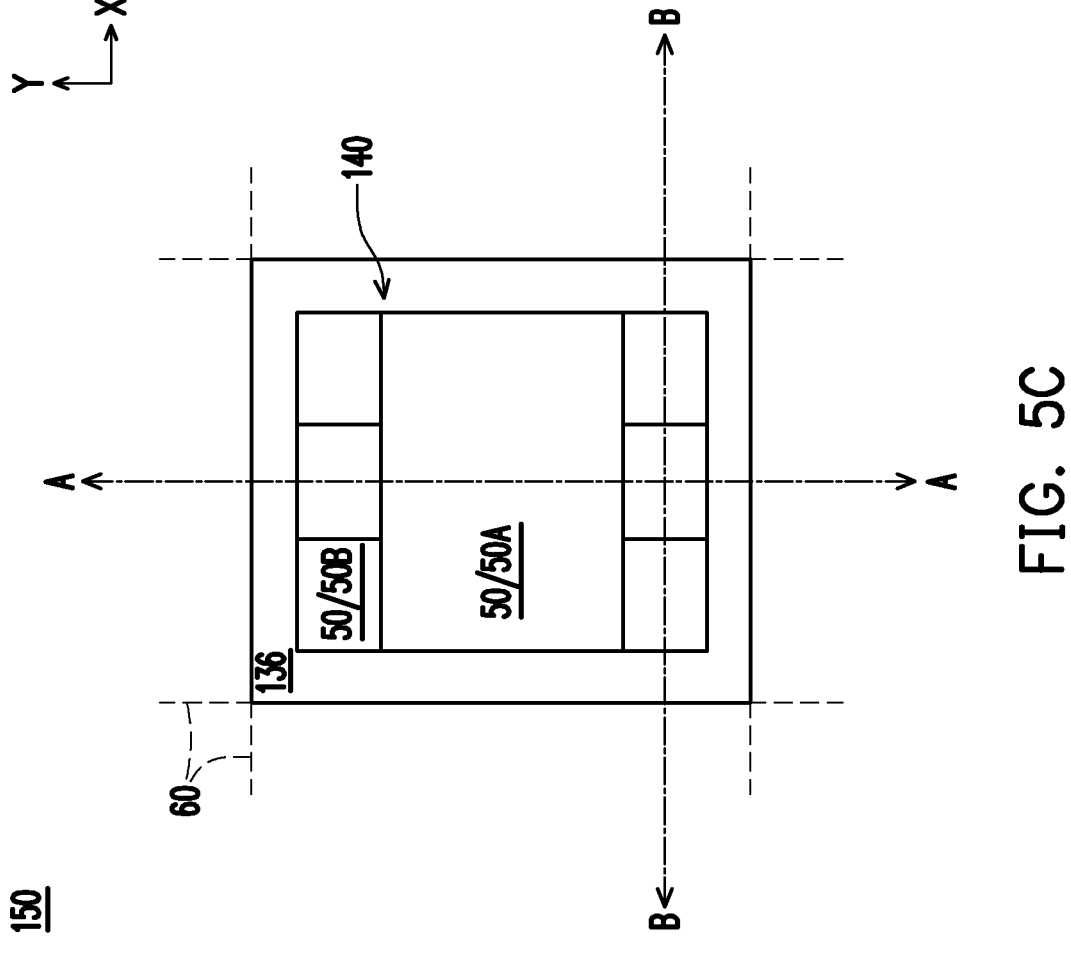

In FIGS. 5A-5C, the carrier wafer 130 is removed from the interposer 102, under-bump metallizations (UBMs) 146 are formed on the interposer 102 (e.g., the metallization layer 112), and conductive connectors 148 are formed on the UBMs 146. FIGS. 5A-5B illustrate side views of the package component 150, and FIG. 5C illustrates a plan view (e.g., the X-Y plane) of the package component 150, in accordance with some embodiments. In particular, FIG. 5A illustrates the A-A cross-section (e.g., the Y-Z plane) of FIG. 5C, and FIG. 5B illustrates the B-B cross-section (e.g., the X-Z plane) of FIG. 5C.

For example, in embodiments in which an adhesive layer (not specifically illustrated) is used to hold the interposer 102 to the carrier wafer 130, a debonding process may be performed by, e.g., projecting a light such as a laser light or an ultraviolet (UV) light on the adhesive layer so that the adhesive layer decomposes from the energy and/or the heat of the light, and the carrier wafer 130 can be removed. Optionally, an insulating layer (not specifically illustrated) may be formed on the back surface of the interposer 102, for example, to serve as a passivation layer to protect otherwise exposed features of the metallization layer 112. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. If the insulating layer is present, before forming the UBMs 146 and the conductive connectors 148, the insulating layer may be patterned to form openings to expose the first of the metallization layers 112.

As an example to form the UBMs 146 in this embodiment, a seed layer (not separately illustrated) is formed over the exposed surfaces of the interposer 102. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 146. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 146.

Further, conductive connectors 148 are formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 148 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In accordance with some embodiments, the structure is singulated along scribe regions 60 to separate the package component 150 from other package components 150. The singulation process may include sawing, dicing, or the like. For example, the singulation process can include sawing the encapsulant 136, the interposer 102 (e.g., the dielectric layers 114), and the dielectric layer 118. As a result of the singulation process, the outer sidewalls of the interposer 102 and the encapsulant 136 are laterally coterminous (within process variations). After singulation, the encapsulant 136 may have a lateral thickness or width $W_E$ from outer sidewalls of the integrated circuit dies 50. Although one package region of the interposer 102 is shown for illustrative purposes, it should be appreciated that any quantity of package regions can be simultaneously processed to form any quantity of package components 150 and subsequently singulated to form the individual package components 150.

FIGS. 6A-8E illustrate various additional steps in the manufacturing of the integrated circuit package 100, in accordance with various embodiments. For example, the package component 150 is attached to a package substrate 202, and other features, such as a thermal interface material (TIM) 80 and a lid structure 320, may be attached to the package component 150 and the package substrate 202, thus forming the integrated circuit package 100. A single package component 150, a single package substrate 202, and a single integrated circuit package 100 are illustrated. It should be appreciated that multiple package components 150 can be simultaneously processed to form multiple integrated circuit packages 100. As discussed above, the TIM 80 and the lid structure 320 may be collectively referred to as a heat transfer structure because they serve to draw and dissipate heat away from the integrated circuit dies 50 during their functional use. In some embodiments (not specifically illustrated), the TIM 80 may include more than one TIM 80, wherein each TIM 80 may be disposed over one or more of the integrated circuit dies 50.

Figure 6A:
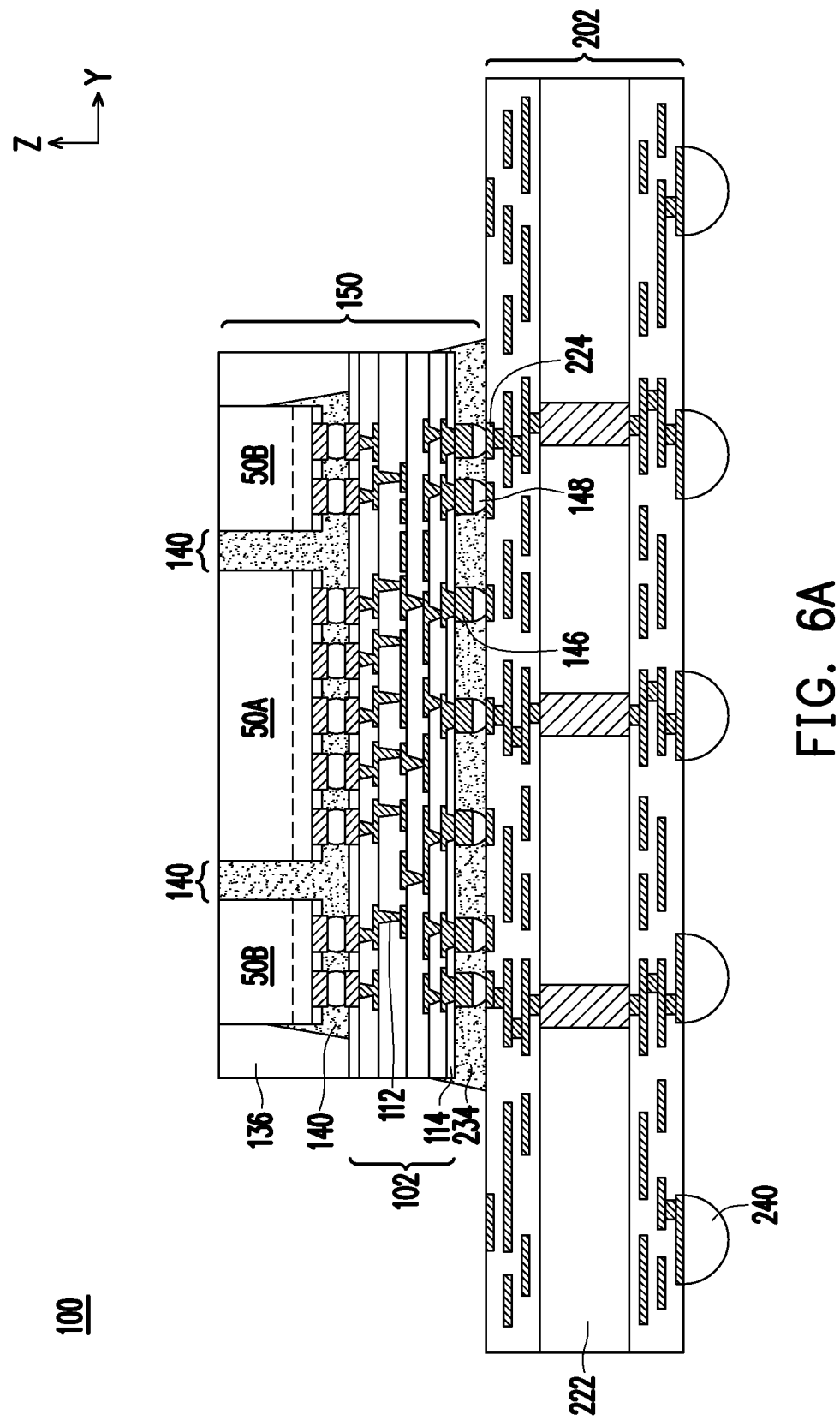
Figure 6B:
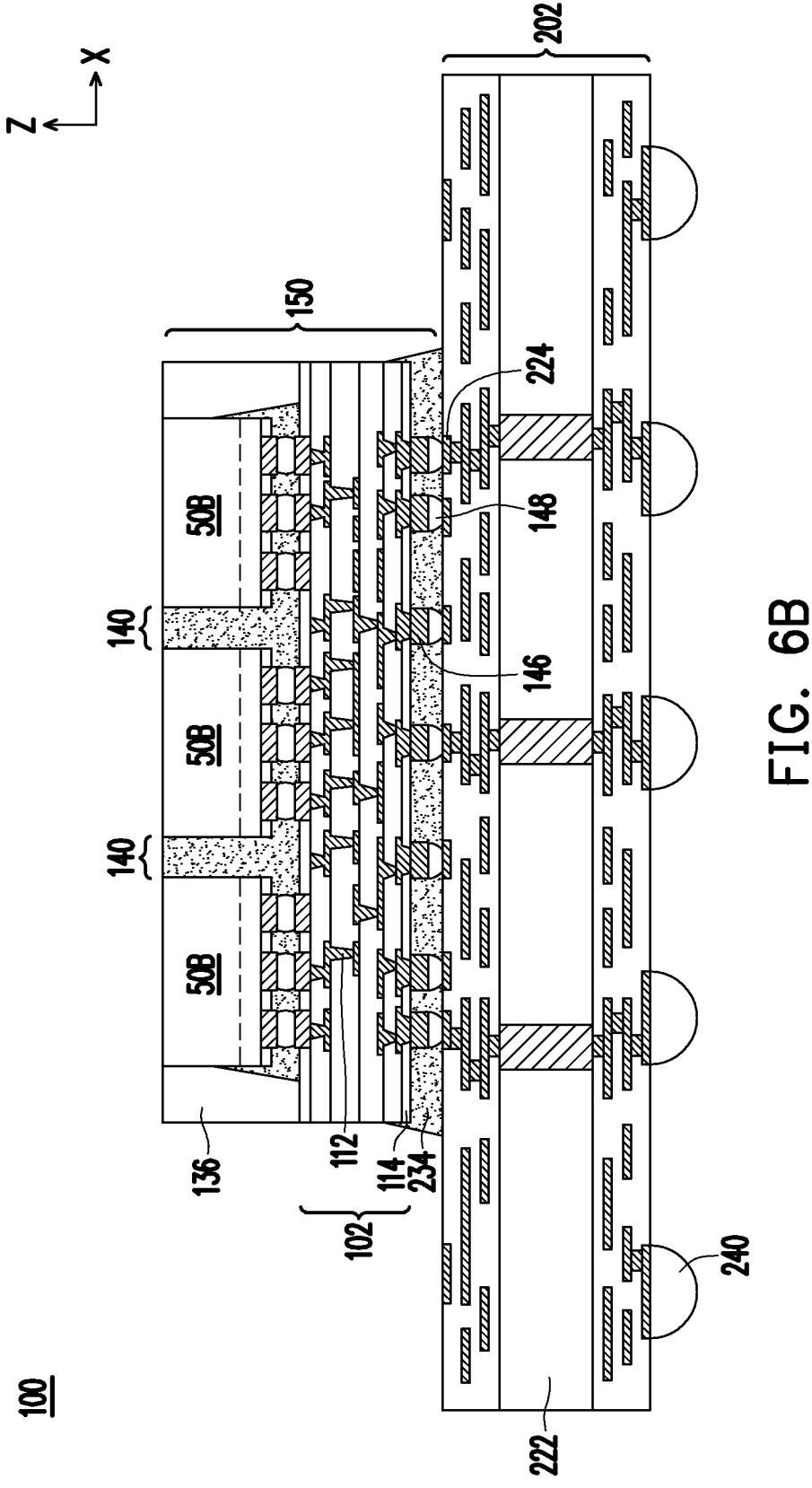
Figure 6C:
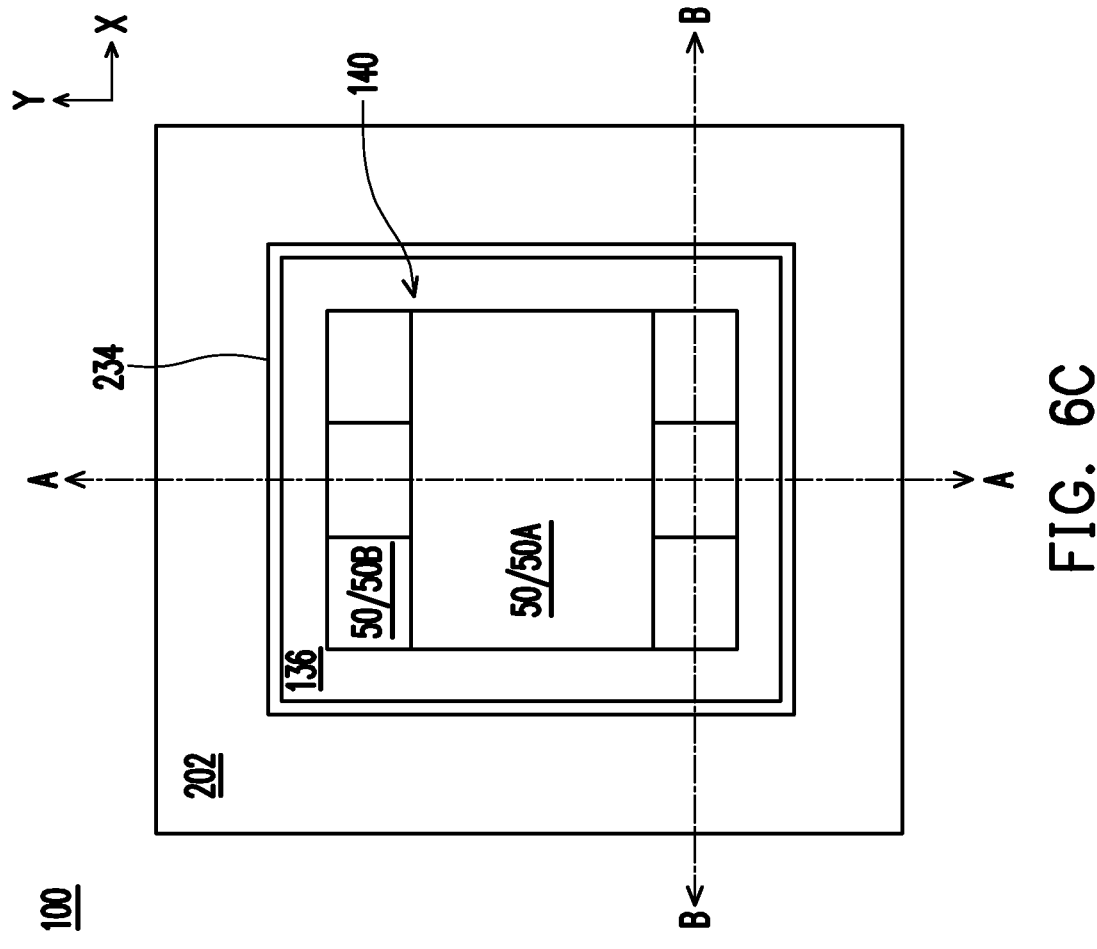

In FIGS. 6A-6C, the package component 150 is attached to a package substrate 202 using the conductive connectors 148. FIGS. 6A-6B illustrate side views of the integrated circuit package 100, and FIG. 6C illustrates a plan view (e.g., the X-Y plane) of the integrated circuit package 100, in accordance with some embodiments. In particular, FIG. 6A illustrates the A-A cross-section (e.g., the Y-Z plane) of FIG. 6C, and FIG. 6B illustrates the B-B cross-section (e.g., the X-Z plane) of FIG. 6C.

In accordance with some embodiments, the package substrate 202 includes a substrate core 222, which may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. In another embodiment, the substrate core 222 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 222 may also include metallization layers and vias, and bond pads 224 over the metallization layers and vias. The metallization layers may be formed over the active and passive devices and are designed to connect the various devices to form functional circuitry. The metallization layers may be formed of alternating layers of conductive lines and conductive vias, wherein the conductive vias interconnect the layers of the conductive lines. The conductive lines and the conductive vias may be formed of copper and embedded in dielectric material (e.g., low-k dielectric material). The metallization layers may be formed through any suitable process (such as deposition, damascene, or the like). In some embodiments, the substrate core 222 is substantially free of active and passive devices.

The conductive connectors 148 are reflowed to attach the UBMs 146 of the interposer 102 to the bond pads 224 of the package substrate 202. The conductive connectors 148 connect the package component 150 (e.g., the metallization layers 112 of the interposer 102) to the package substrate 202 (e.g., metallization layers of the substrate core 222). Thus, the package substrate 202 is electrically connected to the integrated circuit dies 50. In some embodiments, passive devices (e.g., surface mount devices (SMDs), not specifically illustrated) may be attached to the package component 150 (e.g., bonded to the UBMs 146) prior to mounting on the package substrate 202. In such embodiments, the passive devices may be bonded to a same surface of the package component 150 as the conductive connectors 148. In some embodiments (not specifically illustrated), other passive devices (e.g., SMDs) may be attached to the package substrate 202 (e.g., to the bond pads 224). The passive devices may be attached to the package substrate 202 before or after attaching the package component 150 to the package substrate 202.

In some embodiments, an underfill 234 is formed between the package component 150 and the package substrate 202, surrounding the conductive connectors 148. The underfill 234 may be formed by a capillary flow process after the package component 150 is attached or may be formed by any suitable deposition method before the package component 150 is attached. The underfill 234 may be a continuous material extending from the package substrate 202 to the interposer 102 (e.g., to the first of the dielectric layers 114). In some embodiments, some of the passive devices (not specifically illustrated), as discussed above, may be attached to the package substrate 202 after forming the underfill 234.

As further illustrated, the package substrate 202 may include external connectors 240 along a side opposite of the package components 150. The external connectors 240 may facilitate subsequent processing, such as testing (e.g., thermal cycle testing) and/or attachment and electrical connection of the integrated circuit package 100 in an electronic device. In some embodiments (not specifically illustrated), the external connectors 240 may be formed along the package substrate 202 during a later step, such as after attaching the lid structure 320 (see FIGS. 8A-8E).

Figure 7A:
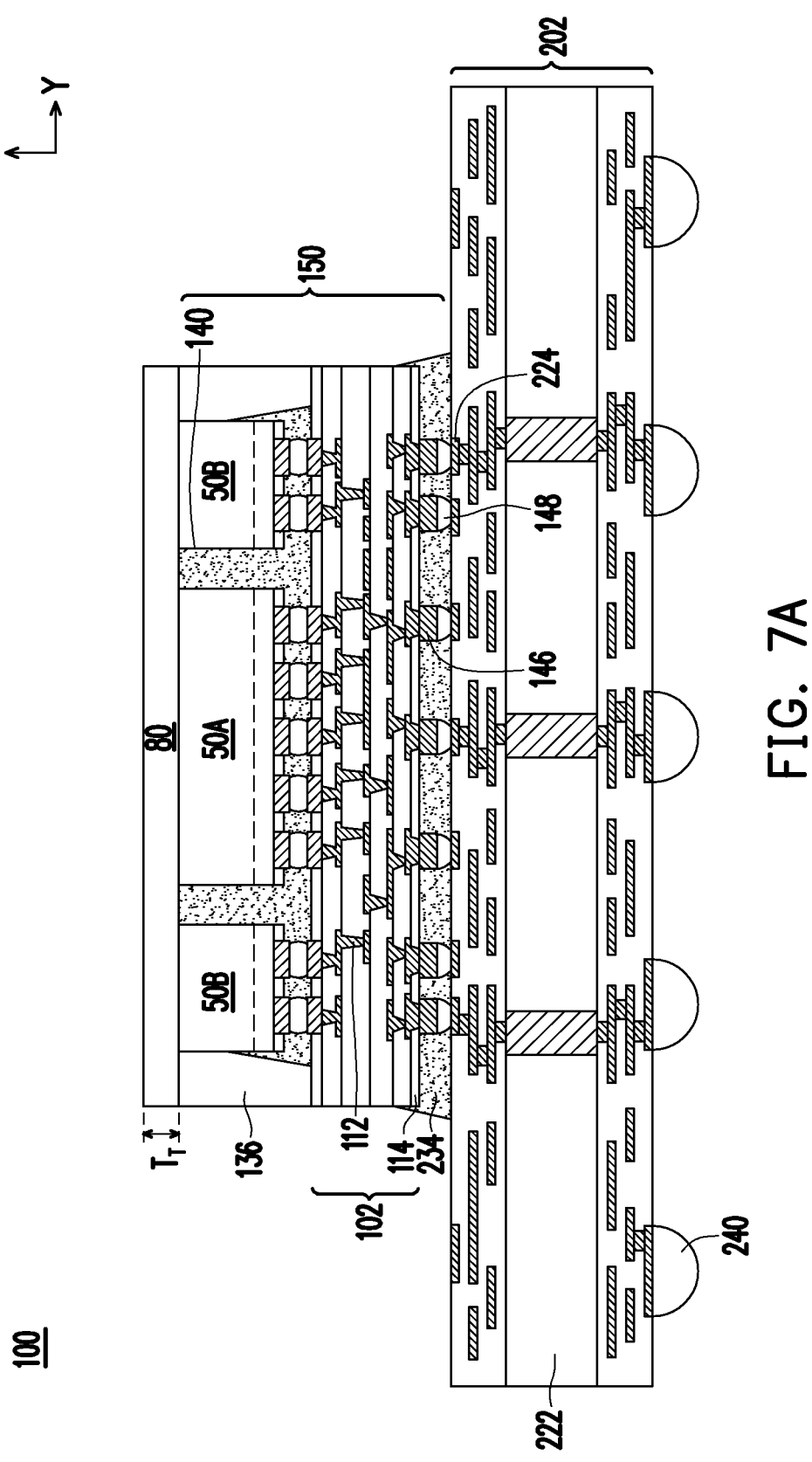
Figure 7B:
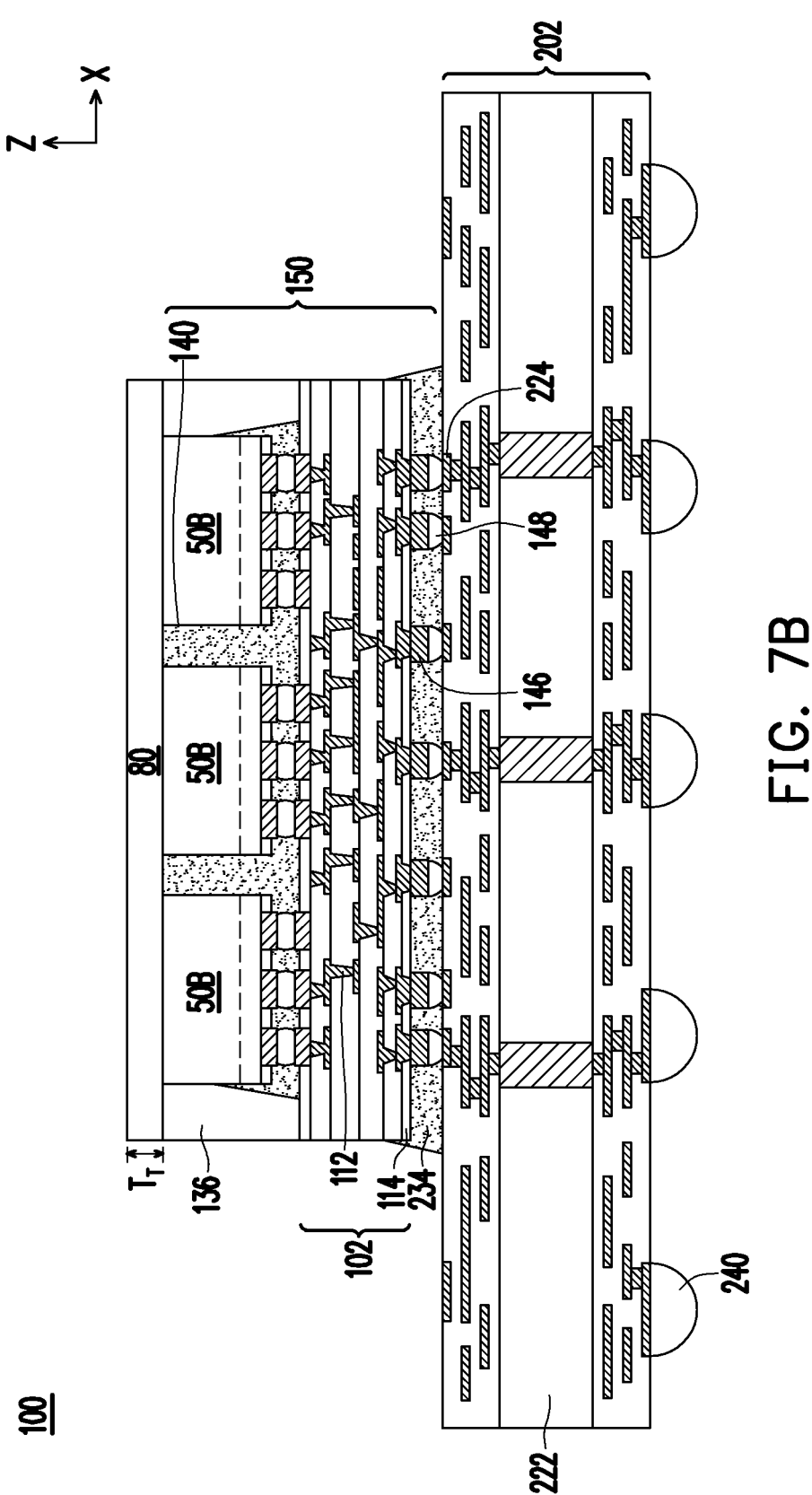
Figure 7C:
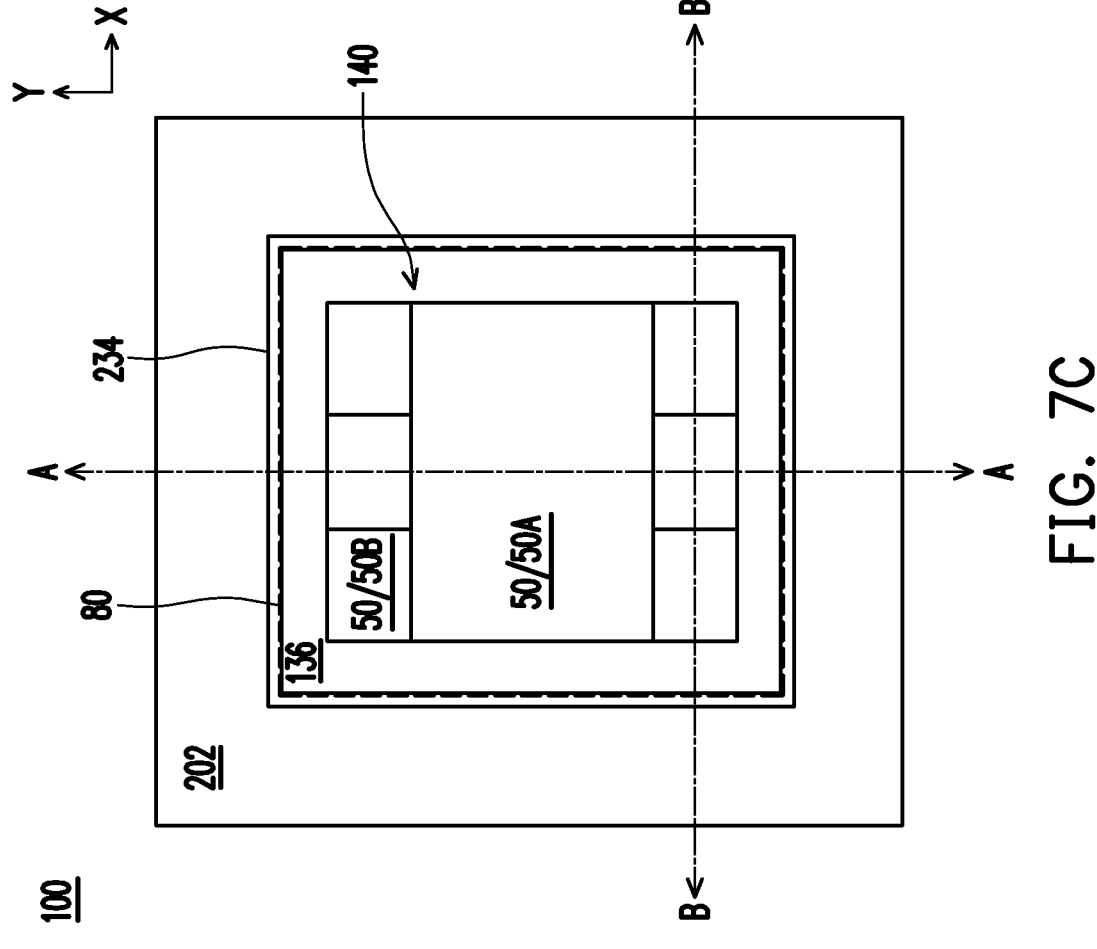

In FIGS. 7A-7C, a thermal interface material (TIM) 80 is attached to the integrated circuit dies 50. The TIM 80 serves to dissipate heat generated by the integrated circuit dies 50 to the subsequently attached lid structure 320. FIGS. 7A-7B illustrate side views of the integrated circuit package 100, and FIG. 7C illustrates a plan view (e.g., the X-Y plane) of the integrated circuit package 100, in accordance with some embodiments. In particular, FIG. 7A illustrates the A-A cross-section (e.g., the Y-Z plane) of FIG. 7C, and FIG. 7B illustrates the B-B cross-section (e.g., the X-Z plane) of FIG. 7C.

In some embodiments, the TIM 80 includes a bulk substrate, and may be formed of a material with high thermal conductivity such as a metal, including an alloy or epoxy, comprising Ag (e.g., greater than or equal to 80 wt. %), In (e.g., 99 wt. %, or as much as 99.99 wt. %), AgIn (e.g., 90 wt. % In and 10 wt. % Ag), AgIn$_2$, AuIn, AuIn$_2$, In$_x$Ni$_y$Au, In$_x$Ni$_y$Ag, other materials such as silicon, ceramic, heat conductive glass, copper, iron, combinations or alloys thereof, or the like. The TIM 80 may also be referred to as a heat dissipation die, a heat dissipation feature, a dummy die, or a thermal enhancement die.

As illustrated, the TIM 80 may be disposed over all of the integrated circuit dies 50 and extend laterally beyond perimeter sidewalls of the integrated circuit dies 50. For example, the TIM 80 may have a thickness T$_T$ above the integrated circuit dies 50. In addition, a total area (e.g., a footprint) of the TIM 80 may be greater than or equal to a total area (e.g., a footprint) of the integrated circuit dies 50 including the gap regions 140 there-between. In some embodiments (not specifically illustrated), the total area of the TIM 80 may be less than the total footprint of the integrated circuit dies 50.

Figure 8A:
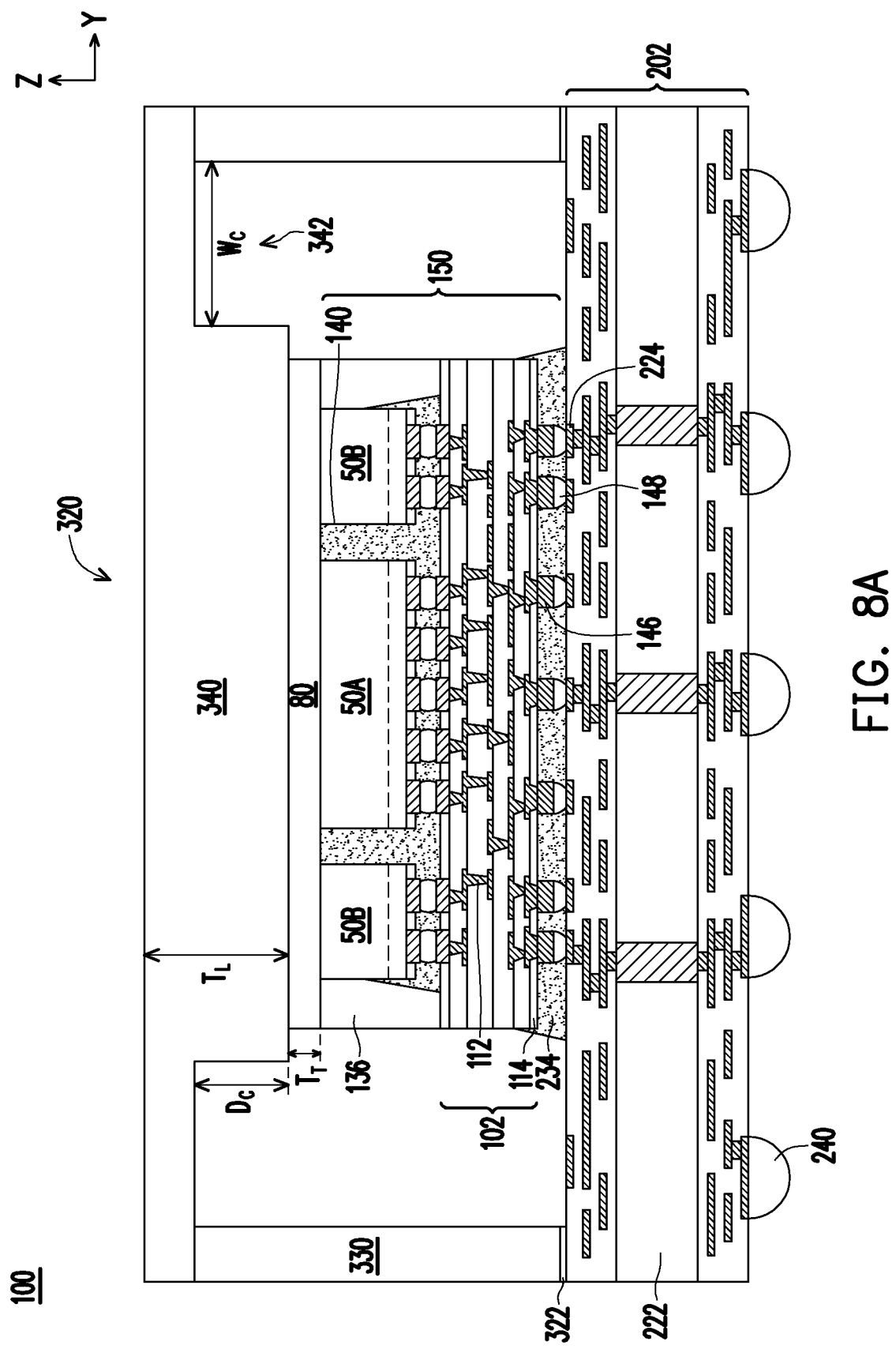
Figure 8B:
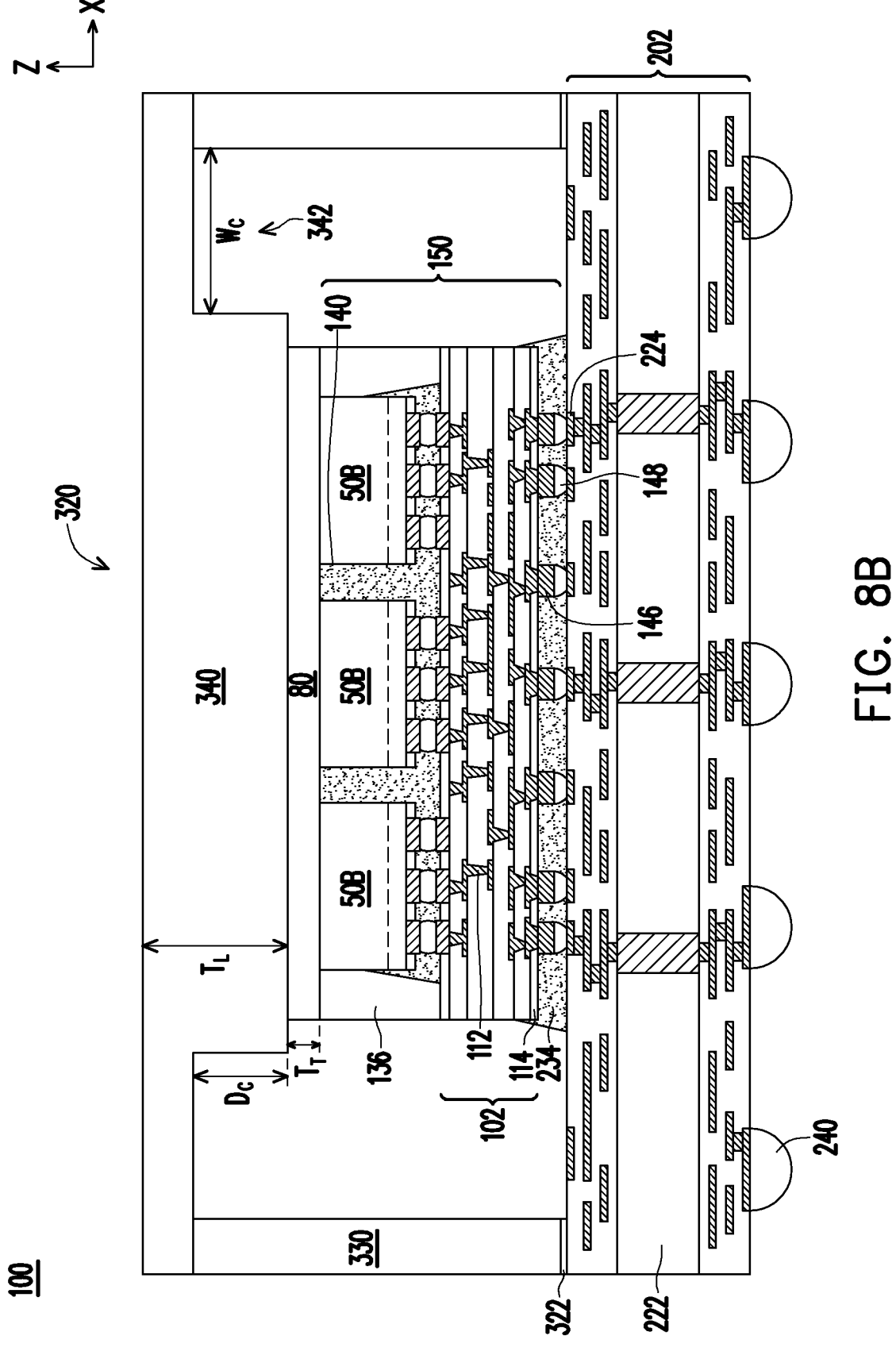
Figure 8C:
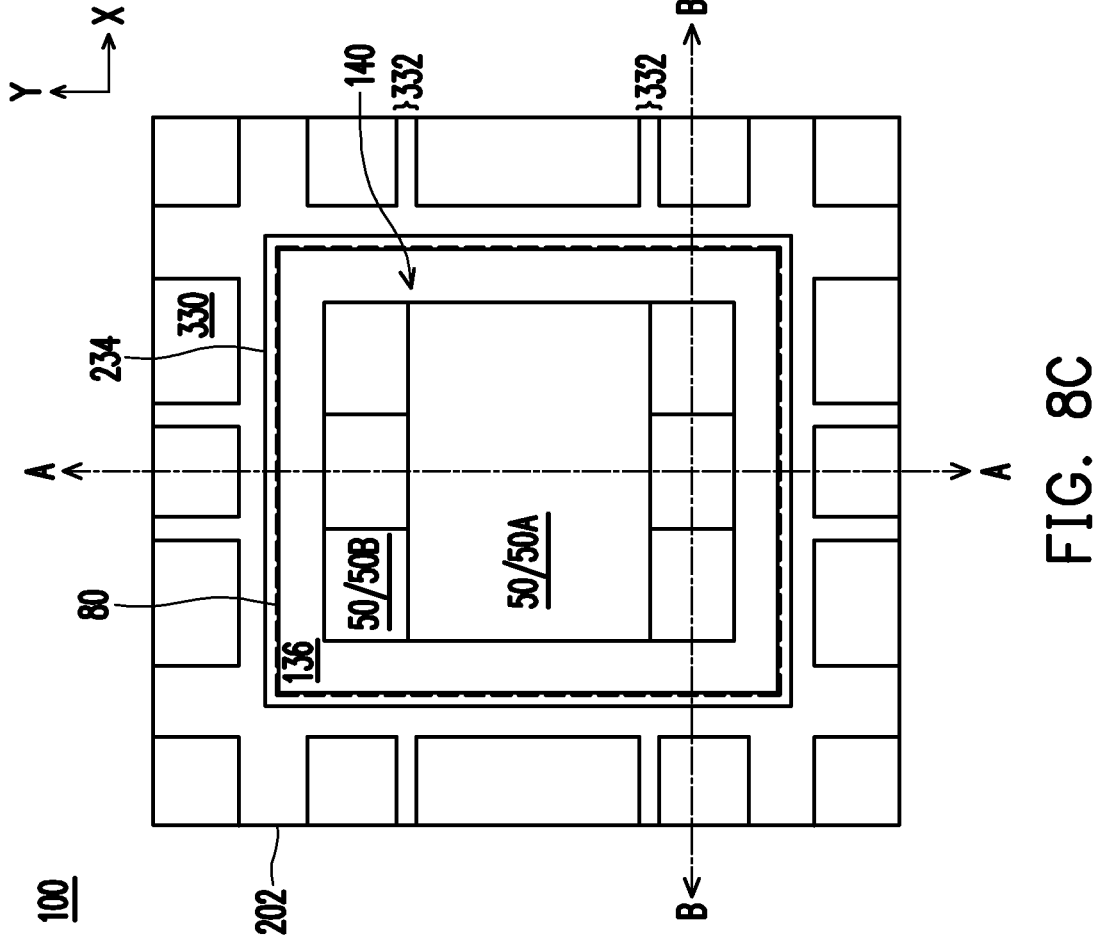
Figure 8D:
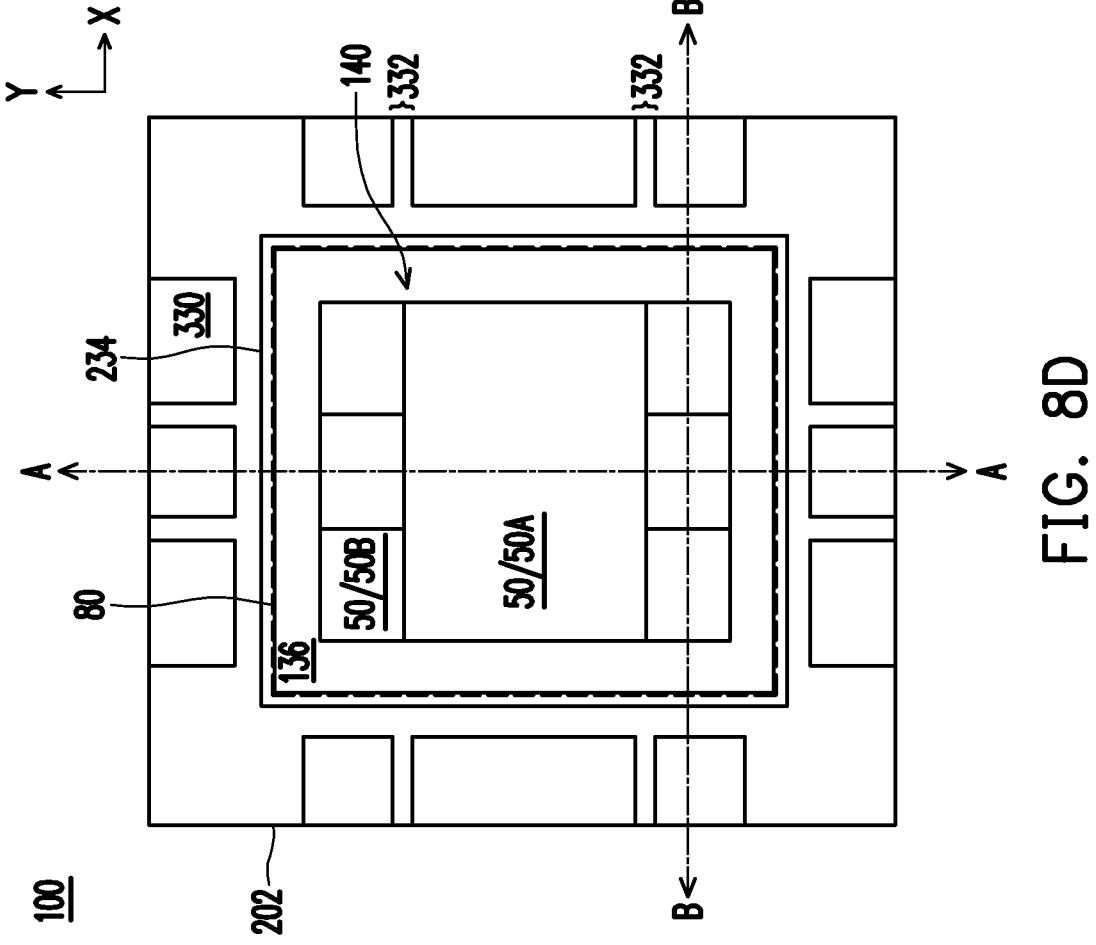
Figure 8E:
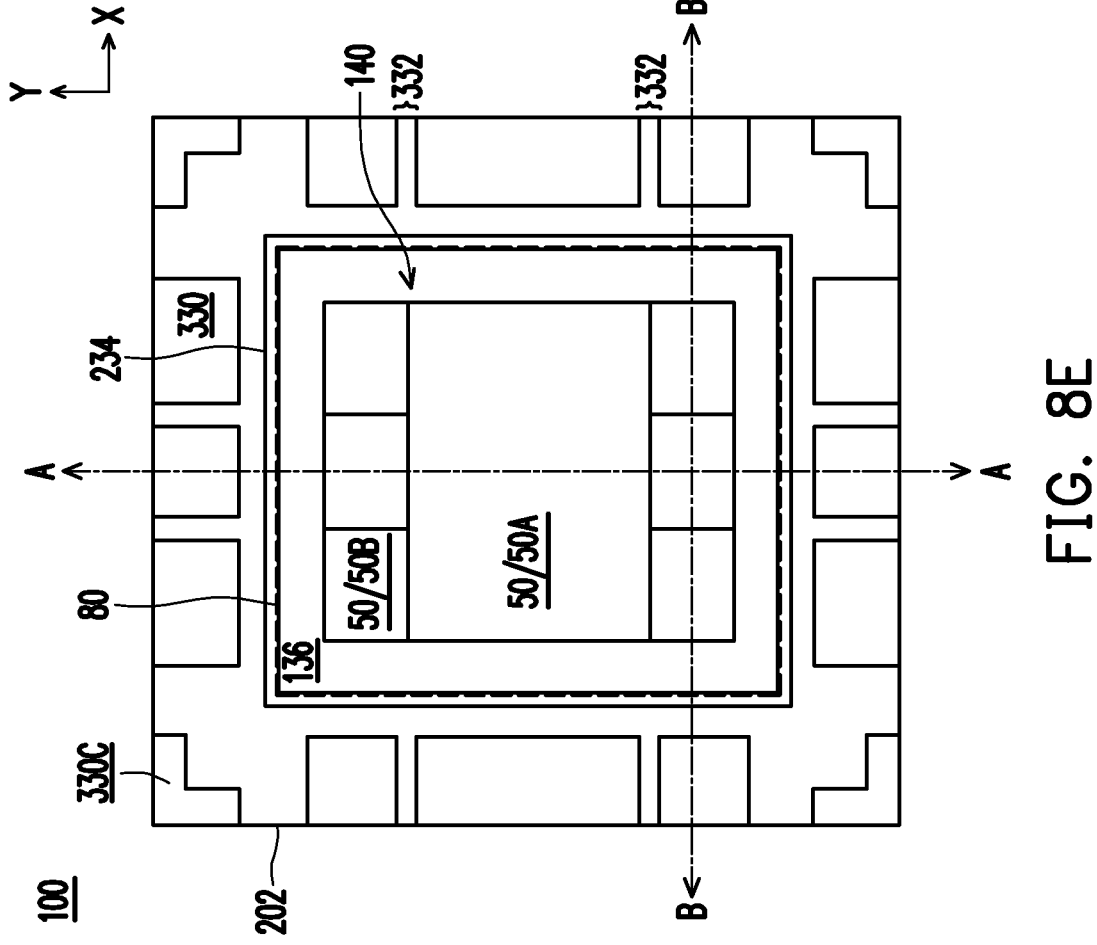

In FIGS. 8A-8E, a lid structure 320 is attached to the package substrate 202, around the package component 150, and over the TIM 80. The lid structure 320 may serve as the heat spreading portion of the heat transfer structure. In some embodiments, the lid structure 320 may include lid feet 330 and a lid cap 340. The lid feet 330 are attached to the package substrate 202 and surround the package component 150, and the lid cap 340 is disposed over and/or attached to the TIMs 80. FIGS. 8A-8B illustrate side views of the integrated circuit package 100, and FIGS. 8C-8E illustrate plan views (e.g., the X-Y plane) of the integrated circuit package 100, in accordance with various embodiments. In particular, FIG. 8A illustrates the A-A cross-section (e.g., the Y-Z plane) of FIGS. 8C-8E, and FIG. 8B illustrates the B-B cross-section (e.g., the X-Z plane) of FIGS. 8C-8E.

In some embodiments, the lid structure 320 may have a rigidity greater than that of the package substrate 202, and the lid feet 330 may serve as stiffeners for constraining the package substrate 202. For example, the lid feet 330 minimize warpage in the integrated circuit package 100, which may otherwise be caused when subsequent processing steps or testing (e.g., thermal cycling testing) include thermal sub-processes that may cause components with different thermal expansion properties to expand by varying amounts. For example, attachment of the lid structure 320 and thermal cycle testing may cause warpage in the integrated circuit package 100 due to varying thermal expansions.

The lid structure 320 may be made of one or more materials. For example, the lid feet 330 (e.g., in particular, lower parts that are proximal to the package substrate 202) may be formed of a rigid material having a coefficient of thermal expansion (CTE) similar to that of the underlying package substrate 202, thereby reducing CTE mismatch there-between and reducing stress on the package substrate 202. In addition, materials of the lid cap 340 (and, optionally, upper parts of the lid feet 330 proximal to the lid cap 340) may include metals such as copper, stainless steel, stainless steel/nickel, the like, and combinations and alloys thereof. For example, the lid cap 340 may be mostly copper with a gold and/or silver coating along parts of an inner surface facing the TIM 80. In some embodiments, the thermal conductivity of the lid cap 340 may be greater than the thermal conductivity of the lid feet 330. For example, the lid cap 340 may have a thermal conductivity ranging from 100 W/cm-K to 1500 W/cm-K, and the lid feet 330 may have a thermal conductivity ranging from 100 W/cm-K to 1500 W/cm-K.

In some embodiments, the lid structure 320 is placed on the package substrate 202 and held in place using an adhesive layer 322 interposed between bottom surfaces of the lid feet 330 lid structure and an upper surface of the package substrate 202. The adhesive layer 322 may be any suitable non-conductive adhesive, epoxy, die attach film (DAF), or the like, and may be applied to the bottom surface of the lid feet 330 or may be applied over the upper surface of the package substrate 202 before installing the lid structure 320. In some embodiments, other adhesive layers (not specifically illustrated) along an inner surface of the lid cap 340 lid structure may be used to improve attachment of the lid structure 320 to the TIM 80. In some embodiments (not specifically illustrated), the lid feet 330 are first formed over or attached to the package substrate 202, and the lid cap 340 is subsequently attached to the lid feet 330 to form the lid structure 320 using an adhesive or any suitable method.

After placing the lid structure 320 onto the package substrate 202, an optional baking process may be performed to form bonds between the TIM 80 and the lid cap 340. For example, the TIM 80 may form bonds with, e.g., the gold and/or silver coating along the inner surface of the lid cap 340. As such, the TIM 80 may form strong intermetallic bonds with the lid cap 340.

Referring to the plan views of various embodiments depicted in FIGS. 8C-8E, the lid feet 330 are arranged along a perimeter of the integrated circuit package 100 along the package substrate 202. As illustrated, the lid feet 330 surround the package component 150 and the passives devices (if present) along the package substrate 202, wherein the lid feet 330 form a discontinuous. As illustrated, the lid feet 330 are separated from one another by grooves 332 so that the lid feet 330 are discrete from one another. In addition, the lid feet 330 may have rectangular shapes of varying sizes and dimensions. In some embodiments (not specifically illustrated), some of the lid feet 330 have the same size and dimensions. By being in discrete portions, the lid feet 330 are able to improve flexibility of the lid structure 320 to account for warpage in the integrated circuit package 100, such as due to differing thermal expansions among the package substrate 202, the first integrated circuit die 50A, and the second integrated circuit dies 50B.

As illustrated, the grooves 332 separate adjacent pairs of the lid feet 330. In some embodiments, some of the grooves 332 may be aligned with corresponding gap regions 140 between proximal pairs of integrated circuit dies 50. By being aligned with the gap regions 140, the grooves 332 increase the flexibility of the lid structure 320 to account for varying thermal expansions of the components of the integrated circuit package 100.

In accordance with some embodiments, the grooves 332 may have a width ranging from 100% to 500% of a width of the gap regions 140. A width of the grooves 332 greater than 100% of the width of the gap regions 140, such as greater than or equal to 200% of the width of the gap regions 140, provides flexibility in the lid structure 320 to reduce stress from warpage of the package substrate 202 during various processing steps, such as attachment of the package component 150 and/or subsequent processing an testing of the integrated circuit package 100. In addition, a width of the grooves 332 less than 500% of the width of the gap regions 140, such as less than or equal to 200% of the width of the gap regions 140, gives the lid structure 320 sufficient structural integrity to reduce warpage of the package substrate 202 that may otherwise occur during the various processing steps discussed above. In some embodiments (not specifically illustrated), some of the grooves 332 may be misaligned with the gap regions 140 between proximal pairs of the integrated circuit dies 50.

Referring to FIG. 8D, in some embodiments, the lid feet 330 may be omitted from corner regions of the package substrate 202 to improve flexibility of the lid structure 320 and to prevent stresses that may develop if corners of the underfill 234 are too proximal to the lid feet 330. Referring to FIG. 8E, corner lid feet 330C may be disposed in the corner regions of the integrated circuit package 100 and have a concave shape (e.g., with respect to the package component 150) to prevent or reduce the above-described stresses. In particular, the concave shape allows the corner lid feet 330C to maintain sufficient distance from the corners of the underfill 234. In some embodiments, the corner lid feet 330C may have an L-shape (as illustrated) or a curved concave shape (not specifically illustrated). As such, in the embodiments of FIGS. 8D-8E, the corners of the underfill 234 may be a distance of 3 mm to 5 mm (or greater) from the most proximal of the lid feet 330 whether in the corner regions or elsewhere.

In accordance with some embodiments, the lid cap 340 of the lid structure 320 may further include a cavity 342 proximal to the lid feet 330 of the lid structure 320. The cavity 342 improves flexibility between the lid cap 340 and the lid feet 330 to ensure the lid cap 340 maintains complete physical and thermal contact with the TIM 80, for example, in cases in which warpage of the package substrate 202 applies stresses to the lid structure 320 and forms strains between the lid feet 330 and the lid cap 340. As illustrated, the cavity 342 may be a continuous loop internal from and concentric with the lid feet 330. The cavity 342 has a cavity width $W_C$, which may be the same or different in the cross-sections of FIGS. 8A and 8B. The cavity 342 also has a cavity depth Dc into the lid cap 340. In some embodiments (not specifically illustrated), the cavity 230C may be a plurality of discrete cavities 230C instead of forming a single continuous loop.

In some embodiments, a ratio of the cavity depth Dc to a thickness $T_L$ of the lid cap 340 ranges from 0.25 to 0.8. The ratio being greater than 0.25, such as being greater than or equal to 0.5, provides improved flexibility between the lid cap 340 and the lid feet 330. The ratio being less than 0.8, such as being less than 0.5, ensures that the lid structure 320 maintains sufficient structural integrity.

After attachment of the lid structure 320, as discussed above, the integrated circuit package 100 may undergo subsequent processing, such as testing (e.g., thermal cycle testing) and/or being attached to other semiconductor devices or in an electronic device. In some embodiments (not specifically illustrated), the external connectors 240 (if not yet present) may be formed after attaching the lid structure 320.

Figure 9A:
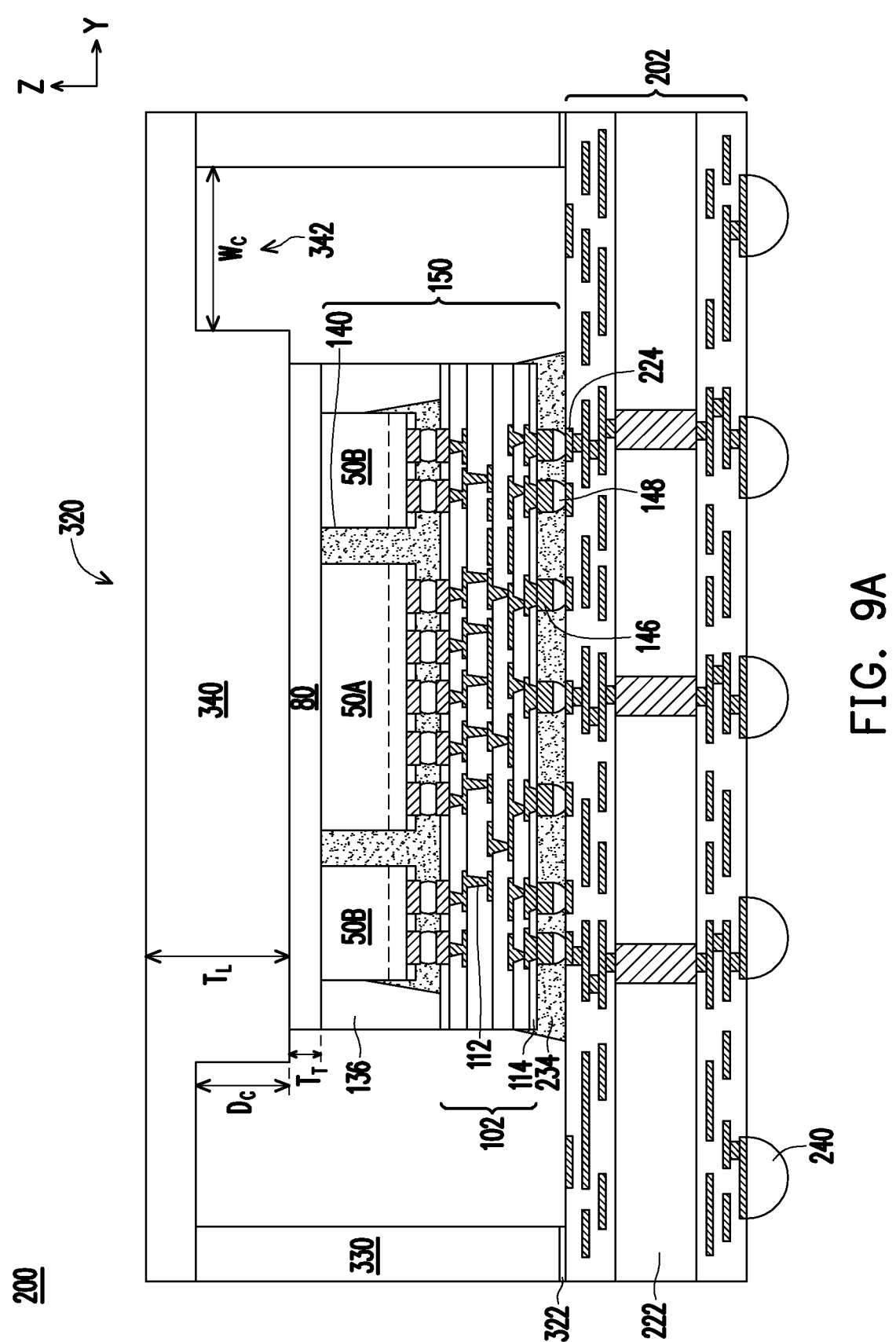
FIGS. 9A-9F are views of intermediate stages in the manufacturing of integrated circuit packages, in accordance with some embodiments.
Figure 9B:
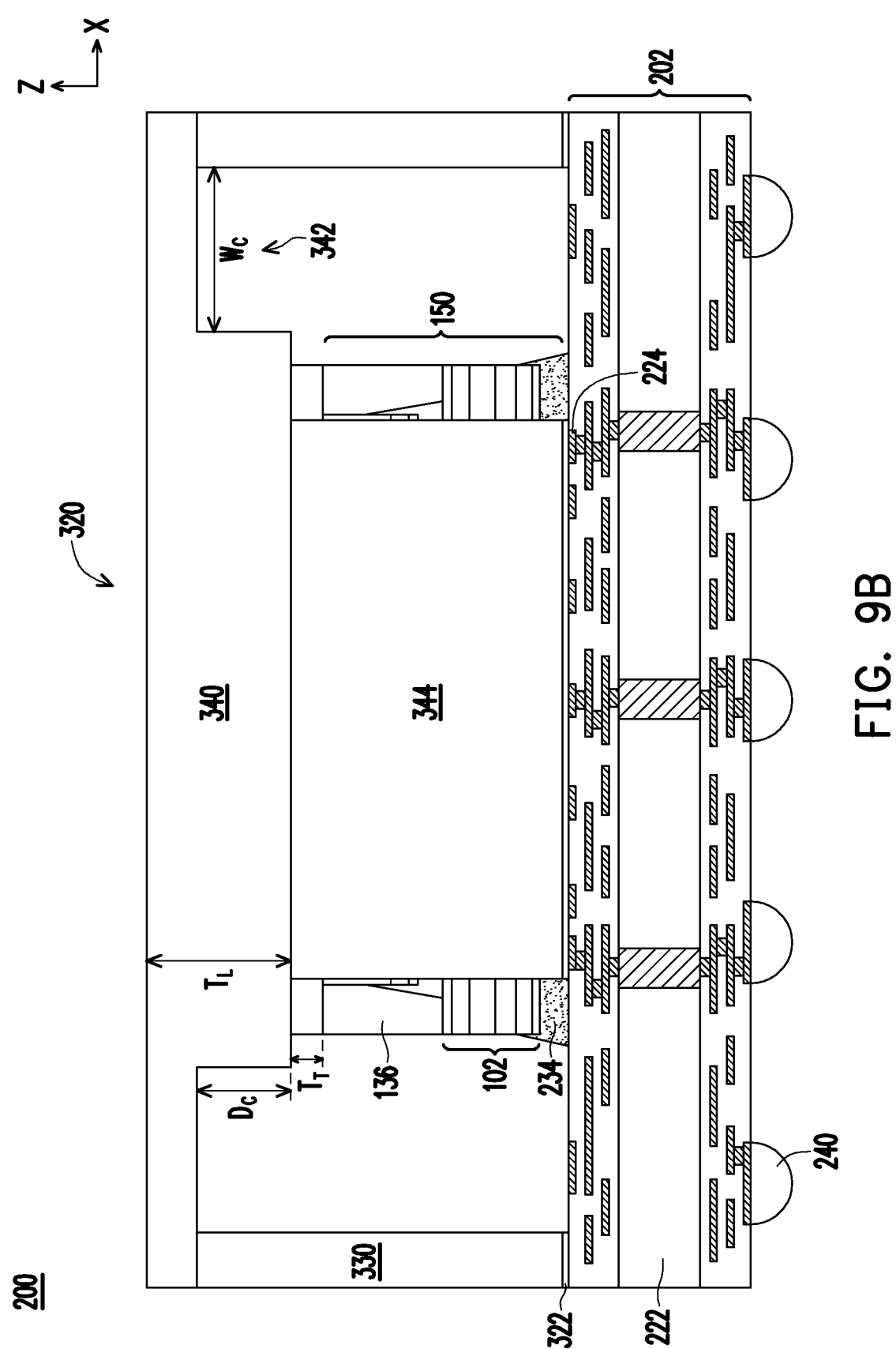
Figure 9C:
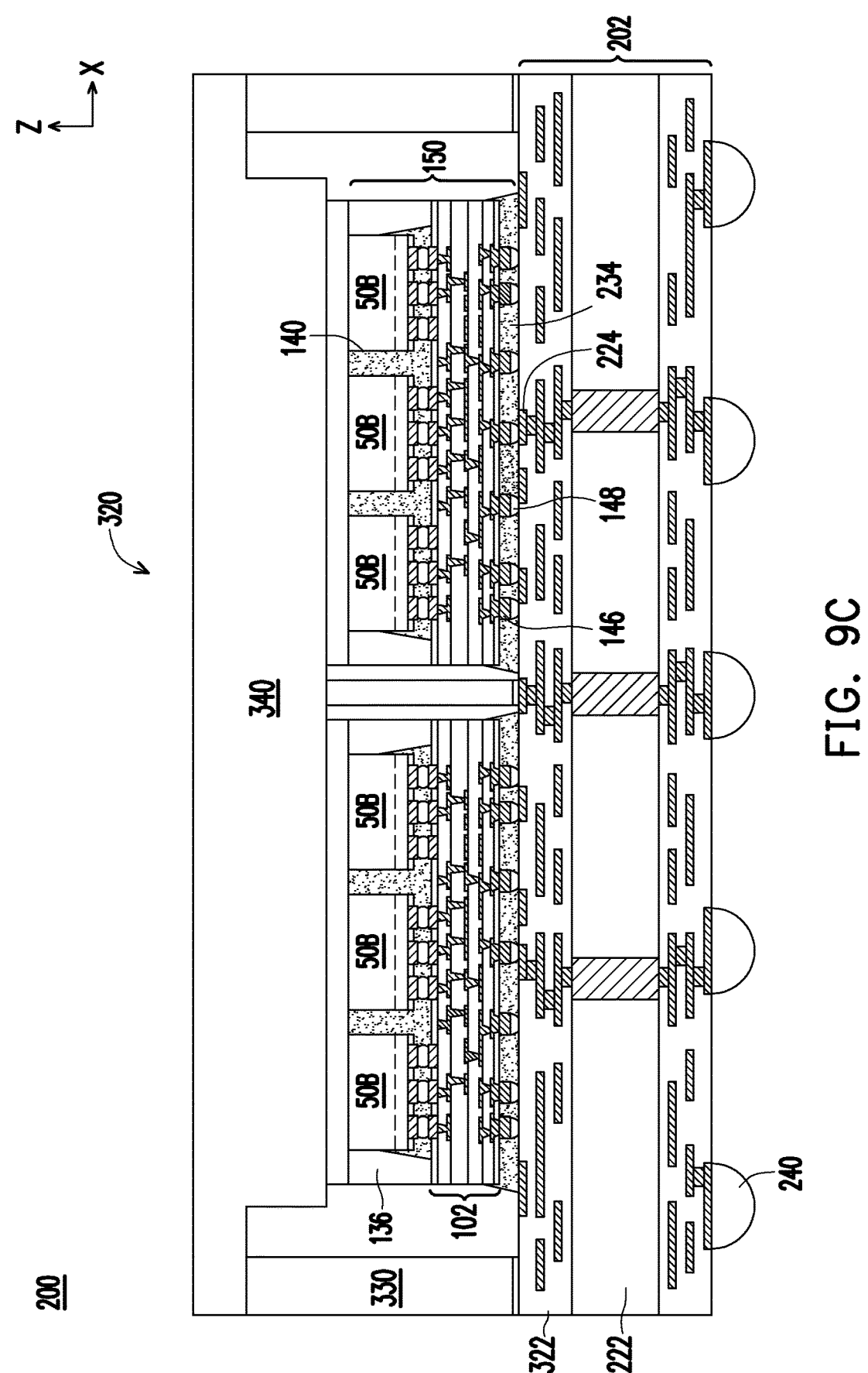
Figure 9D:
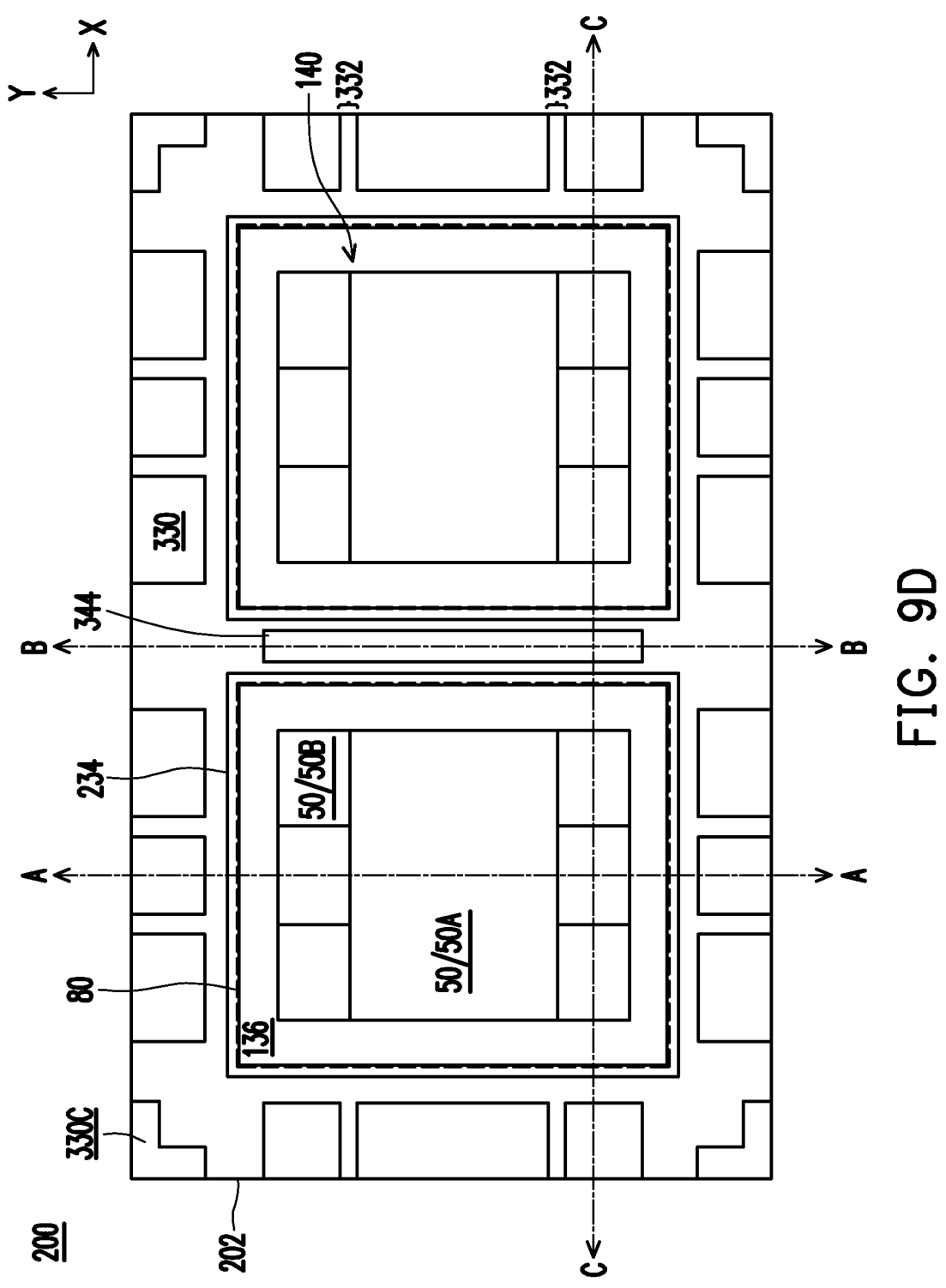
Figure 9E:
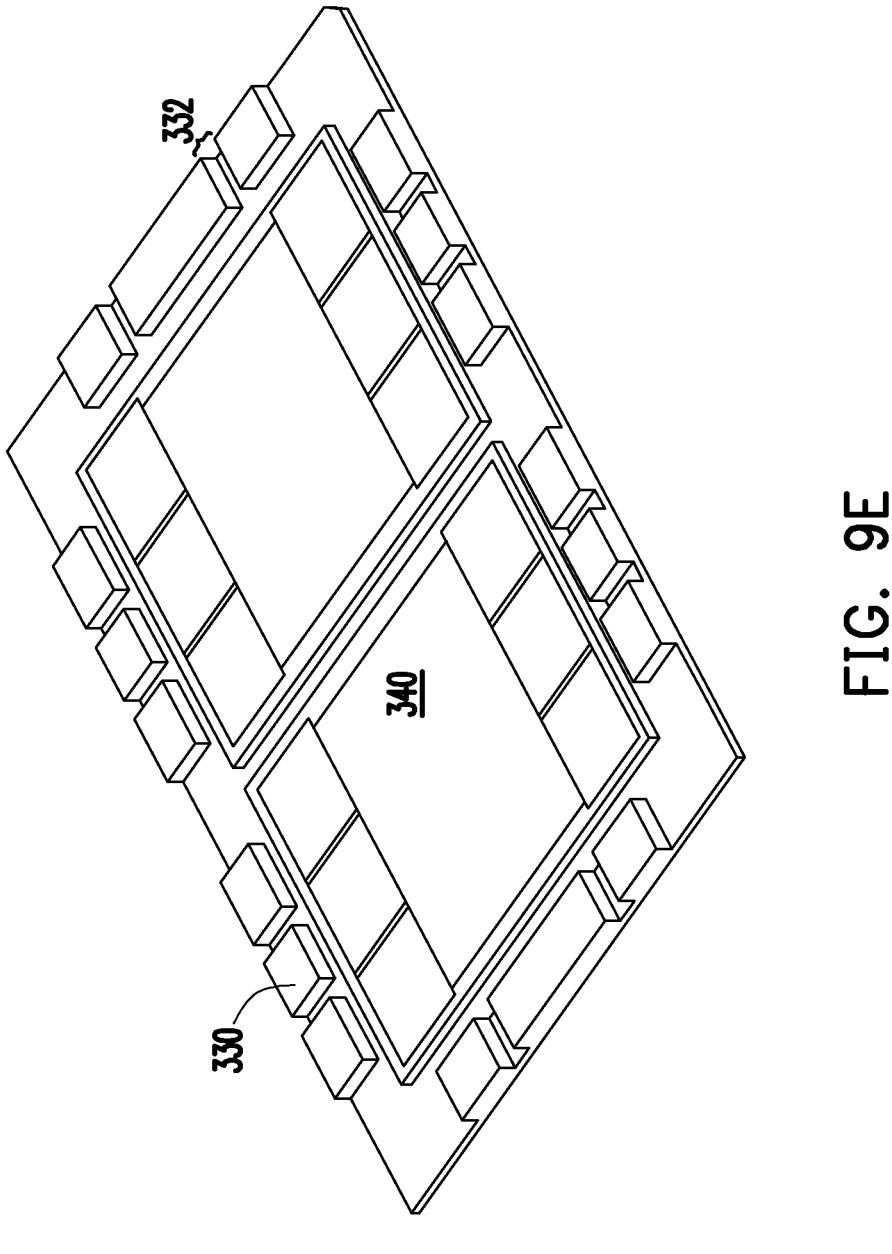
Figure 9F:
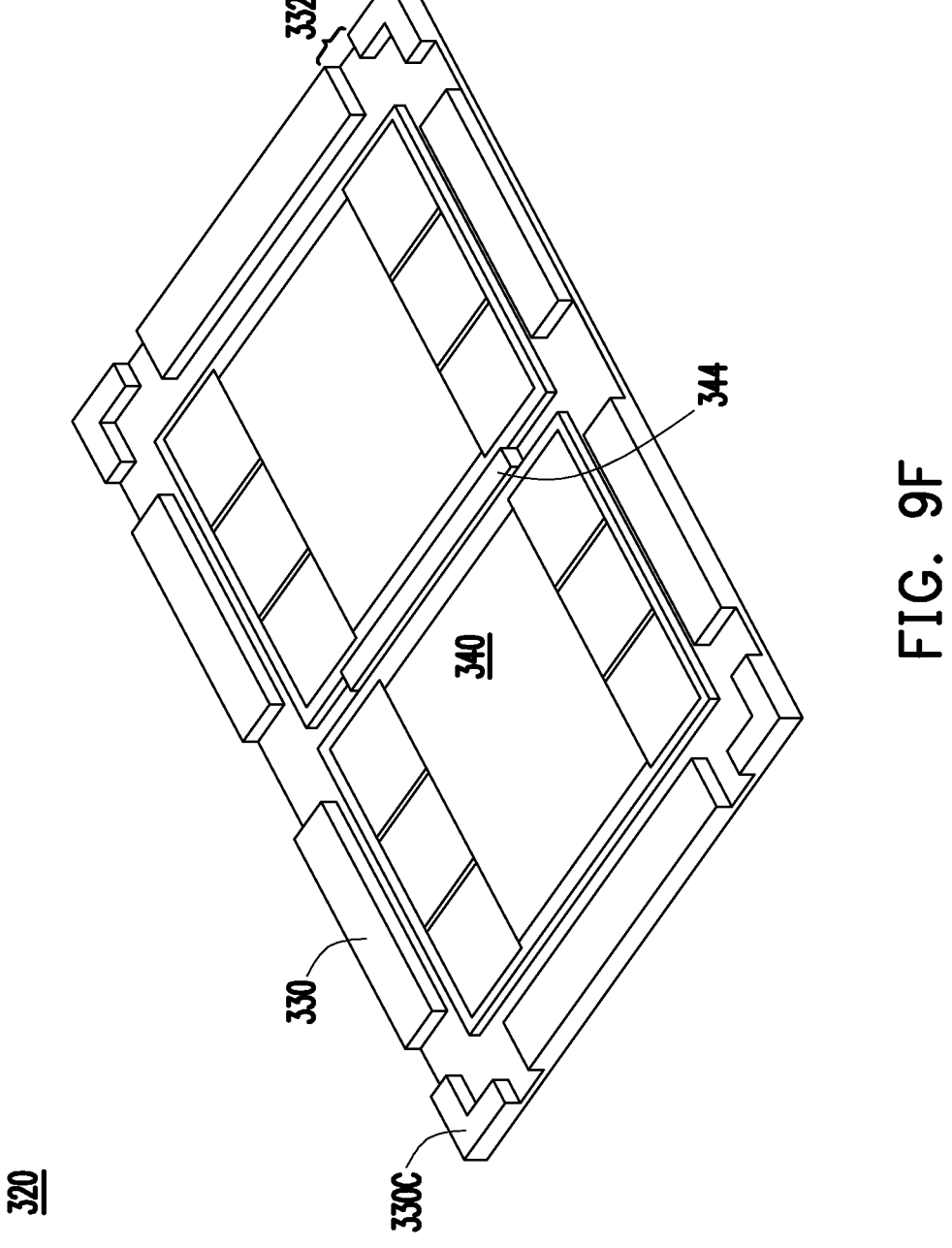

In FIGS. 9A-9F, an integrated circuit package 200 is provided such that multiple package components 150 and multiple TIMs 80 are attached and enclosed within a single lid structure 320. The integrated circuit package 200 may be formed similarly as described above in connection with the integrated circuit package 100, unless otherwise specified. In accordance with various embodiments, optionally, the lid structure 320 further includes a protrusion 344 descending from the lid cap 340 toward the package substrate 202. FIGS. 9A-9C illustrate side views of the integrated circuit package 200, and FIG. 9D illustrates a plan view (e.g., the X-Y plane) of the integrated circuit package 200, in accordance with some embodiments. In particular, FIG. 9A illustrates the A-A cross-section (e.g., the Y-Z plane) of FIG. 9D, FIG. 9B illustrates the B-B cross-section (e.g., a different or parallel cross-section of the Y-Z plane) of FIG. 9D, and FIG. 9C illustrates the C-C cross-section (e.g., the X-Z plane) of FIG. 9D. FIGS. 9E-9F illustrate exemplary embodiments of the lid structure 320 in accordance with these various embodiments of the integrated circuit package 200.

The integrated circuit package 200 may include some or all of the features described above in connection with the integrated circuit package 100, such as including a lid structure 320 having lid feet 330 and a lid cap 340. In addition, the lid cap 340 may include a cavity 342 forming a continuous loop around all of the package components 150. Further, the underfill 234 is formed in discrete portions below each of the package components 150.

As illustrated, the protrusion 344 provides additional structural support to the integrated circuit package 200 by preventing the lid cap 340 from dipping or bowing toward the package substrate 202, for example, in regions between the package components 150 (and corresponding TIMs 80) due to warpage of the integrated circuit package 200 from the various processing steps discussed above. Preventing such dipping or bowing reduces stress and improves the physical and thermal contact between the lid cap 340 and the TIMs 80 as well as between the TIMs 80 and the package components 150. The protrusion 344 may be considered part of the lid cap 340 or considered another of the lid feet 330. As such, the protrusion 344 may be attached or formed similarly as described above in connection with the lid cap 340 or the lid feet 330, respectively.

As illustrated, the protrusion 344 may be a protrusion bar that extends between adjacent package components 150. In some embodiments, a length of the protrusion 344 is less than an adjacent length of the package components 150. In particular, the length of the protrusion 344 may be less than a total length of the adjacent integrated circuit dies 50 (e.g., including the gap regions 140 there-between). In some embodiments (not specifically illustrated), the length of the protrusion 344 may be up to a length of corresponding sets of the lid feet 330 (e.g., the lid feet 330 on opposite sides of the package components 150). In addition, the protrusion 344 may be attached to the package substrate 202 using the adhesive layer 322 used to attach the lid feet 330 to the package substrate 202. As such, the protrusion 344 may have a same height from the package substrate 202 as the lid feet 330. In such embodiments and embodiments in which the cavity 342 is adjacent to the lid feet 330, the lid feet 330 may have an effective height greater than the height of the protrusion 344. In some embodiments (not specifically illustrated), the height of the protrusion 344 may be less than the height of the lid feet 330 and remain only indirectly attached to the package substrate 202. As such, the protrusion 344 serves as a safety support to make contact with the package substrate 202 if warpage causes the lid cap 340 to dip or bow toward the package substrate 202 by an insufficient degree. The point at which the protrusion 344 reaches the package substrate 202 prevents associated stresses from increasing and ensures that sufficient physical contact is maintained between the lid cap 340 and the TIMs 80.

As further illustrated, the lid feet 330 in the corner regions of the package substrate 202 (e.g., or of the integrated circuit package 100) may have a concave shape as discussed above in connection with FIG. 8E to ensure that the lid feet 330 remain a sufficient distance from the corners of the underfill 234. It should be appreciated that the lid feet 330 may have any layout described in previous embodiments (see also FIGS. 8C-8D).

Referring to FIG. 9E, in some embodiments, the lid structure 320 may be configured to cover two or more package components 150 without having a protrusion 344. As illustrated, the lid structure 320 may include the lid feet 330 separated by grooves 332, which may be aligned with the gap regions 140 (see FIGS. 9A-9D) between the integrated circuit dies 50. In addition, the lid structure 320 may have greater flexibility by not having lid feet 330 in the corner regions. Note that any combination of these features and other features described above may be substituted or incorporated into the lid structure 320, such as including the protrusion 344 and/or the lid feet 330 in the corner regions (e.g., the corner lid feet 330C).

Referring to FIG. 9F, in some embodiments, the lid structure 320 may be configured to cover two or more package components 150, wherein the protrusion 344 extends between adjacent package components 150. As illustrated, the lid structure 320 may include lid feet 330 being formed in continuous blocks (e.g., without the grooves 332 separating the lid feet 330 into discrete portions), which increase the rigidity and structural integrity of the lid structure 320. In addition, the lid structure 320 may have even greater rigidity and structural integrity by including the corner lid feet 330C with concave shapes (e.g., L-shapes) at the corner regions of the lid structure 320. Note that any combination of these features and other features described above may be substituted or incorporated into the lid structure 320, such as including the grooves 332 separating the lid feet 330 into discrete portions.

Figure 10A:
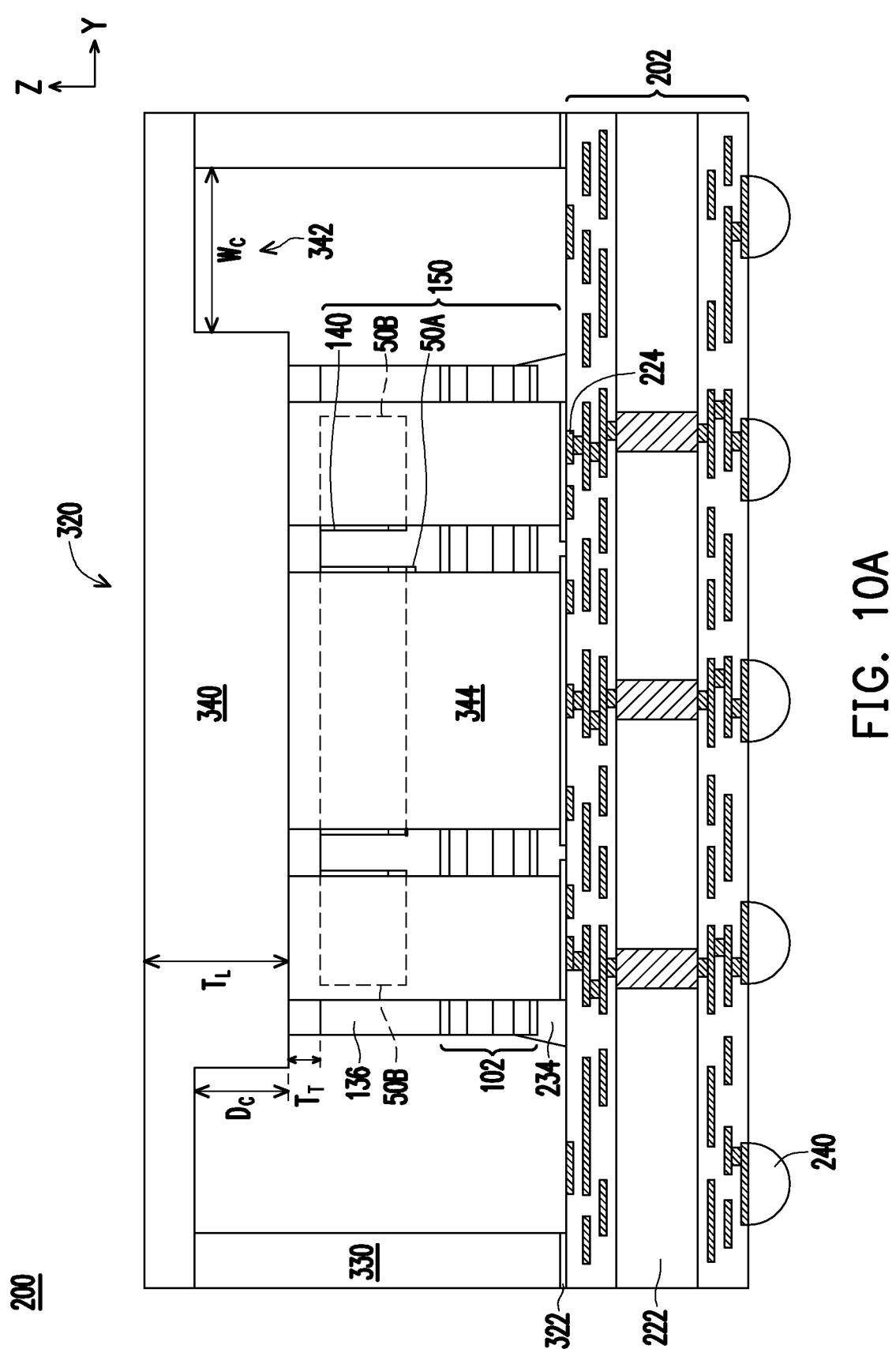
FIGS. 10A-10C are views of intermediate stages in the manufacturing of integrated circuit packages, in accordance with some embodiments.
Figure 10B:
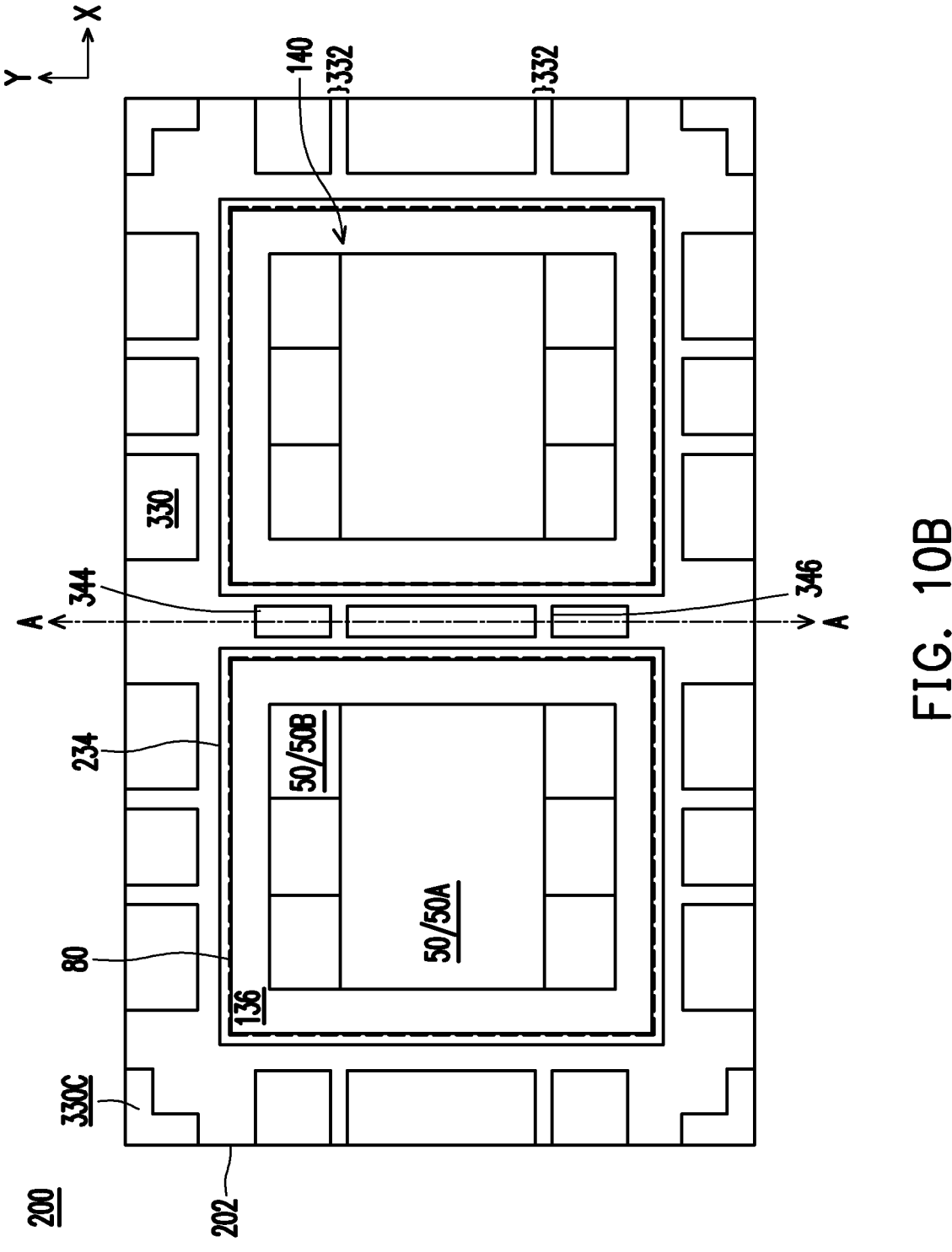
Figure 10C:
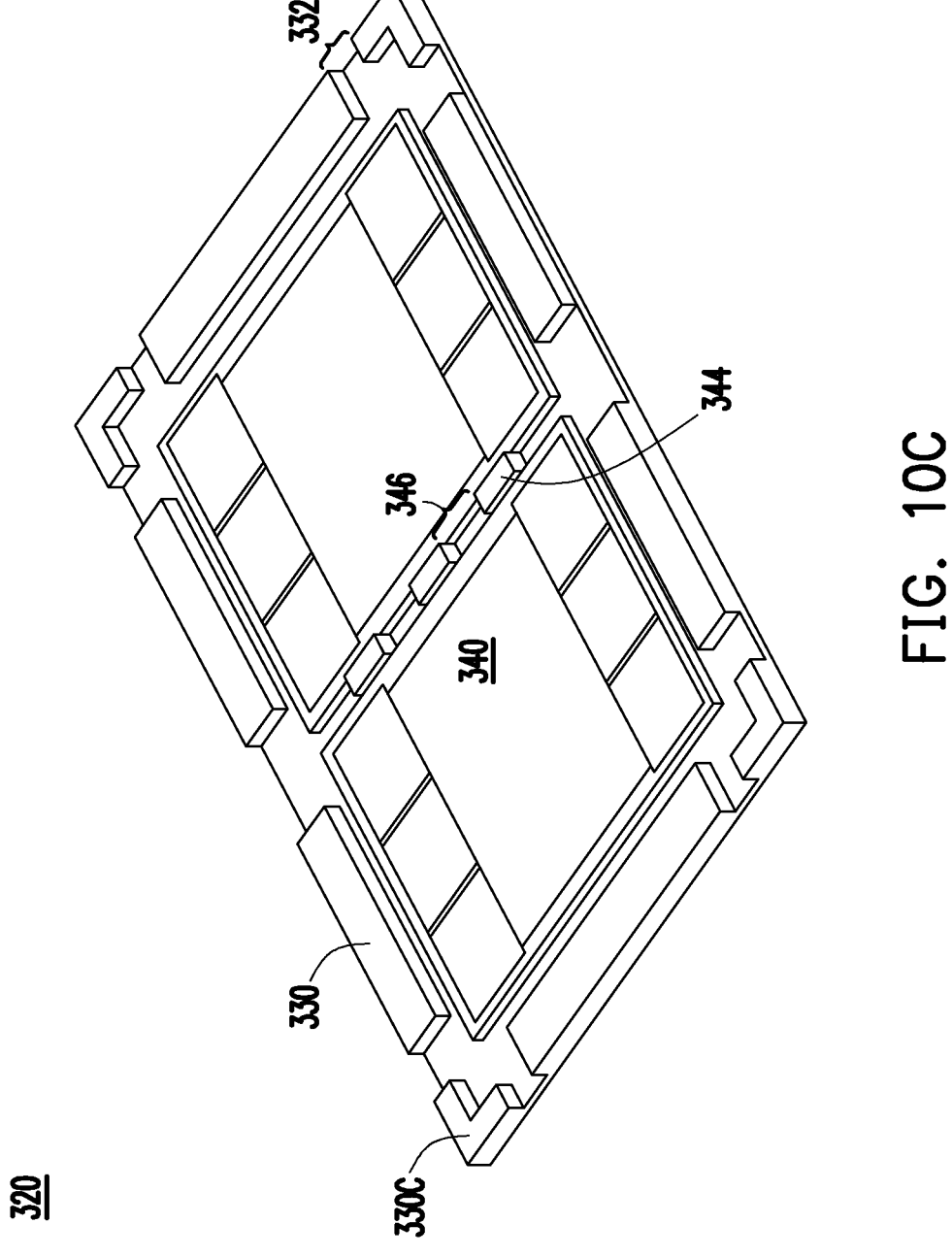

In FIGS. 10A-10C, the integrated circuit package 200 discussed above is provided such that the protrusion 344 includes a plurality of protrusions 344 in the form of discrete protrusion feet (e.g., instead of a single protrusion bar) forming a discontinuous line segment between adjacent package components 150, in accordance with some embodiments. FIG. 10A illustrates the A-A cross-section (e.g., the Y-Z plane) of the plan view depicted in FIG. 10B (e.g., the X-Y plane). FIG. 10C illustrates an exemplary embodiment of the lid structure 320 in accordance with these various embodiments of the integrated circuit package 200.

As illustrated, the protrusions 344 may be protrusion feet due to being separated into discrete portions by protrusion grooves 346. The protrusion grooves 346 achieve the benefits described above while also giving the lid structure 320 increased flexibility, for example, in cases of greater warpage of the integrated circuit package 200. In some embodiments, the protrusions 344 may be aligned with corresponding sets of the lid feet 330 on opposite sides of the package components 150. As such, the protrusion grooves 346 may be aligned with the gap regions 140 between corresponding integrated circuit dies 50 and/or the grooves 332 between corresponding lid feet 330 on an opposing side of one or both of the corresponding package components 150.

Although illustrated with varying lengths (e.g., based on lengths of the integrated circuit dies 50 and the gap regions 140), the protrusions 344 may each have a same length.

Referring to FIG. 10C, in some embodiments, the lid structure 320 may be configured to cover two or more package components 150, wherein the protrusion 344 contains protrusion grooves 346 separating the protrusion 344 into discrete portions (e.g., protrusion feet). As illustrated, the lid structure 320 may include lid feet 330 being formed in continuous blocks (e.g., without the grooves 332 separating the lid feet 330 into discrete portions), which increase the rigidity and structural integrity of the lid structure 320. In addition, the lid structure 320 may have even greater rigidity and structural integrity by including the corner lid feet 330C with concave shapes (e.g., L-shapes) at the corner regions of the lid structure 320. Note that any combination of these features and other features described above may be substituted or incorporated into the lid structure 320, such as including the grooves 332 separating the lid feet 330 into discrete portions. Further, the protrusions 344 may be formed with differing lengths and such that the protrusion grooves 346 are aligned with the gap regions 140 between corresponding integrated circuit dies 50 and/or with the grooves 332 between corresponding lid feet 330.

Figure 11A:
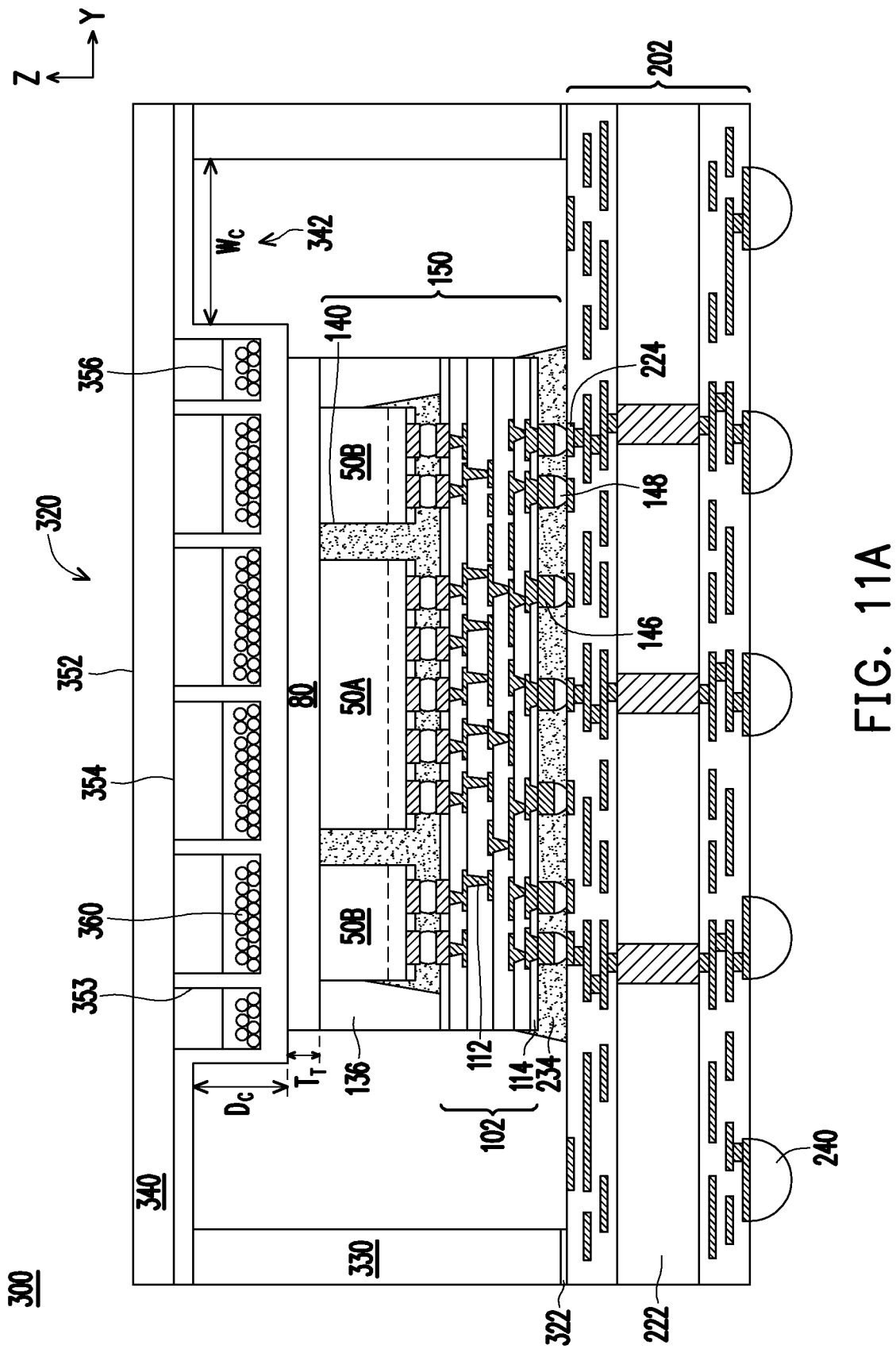
FIGS. 11A-11C are views of intermediate stages in the manufacturing of integrated circuit packages, in accordance with some embodiments.
Figure 11B:
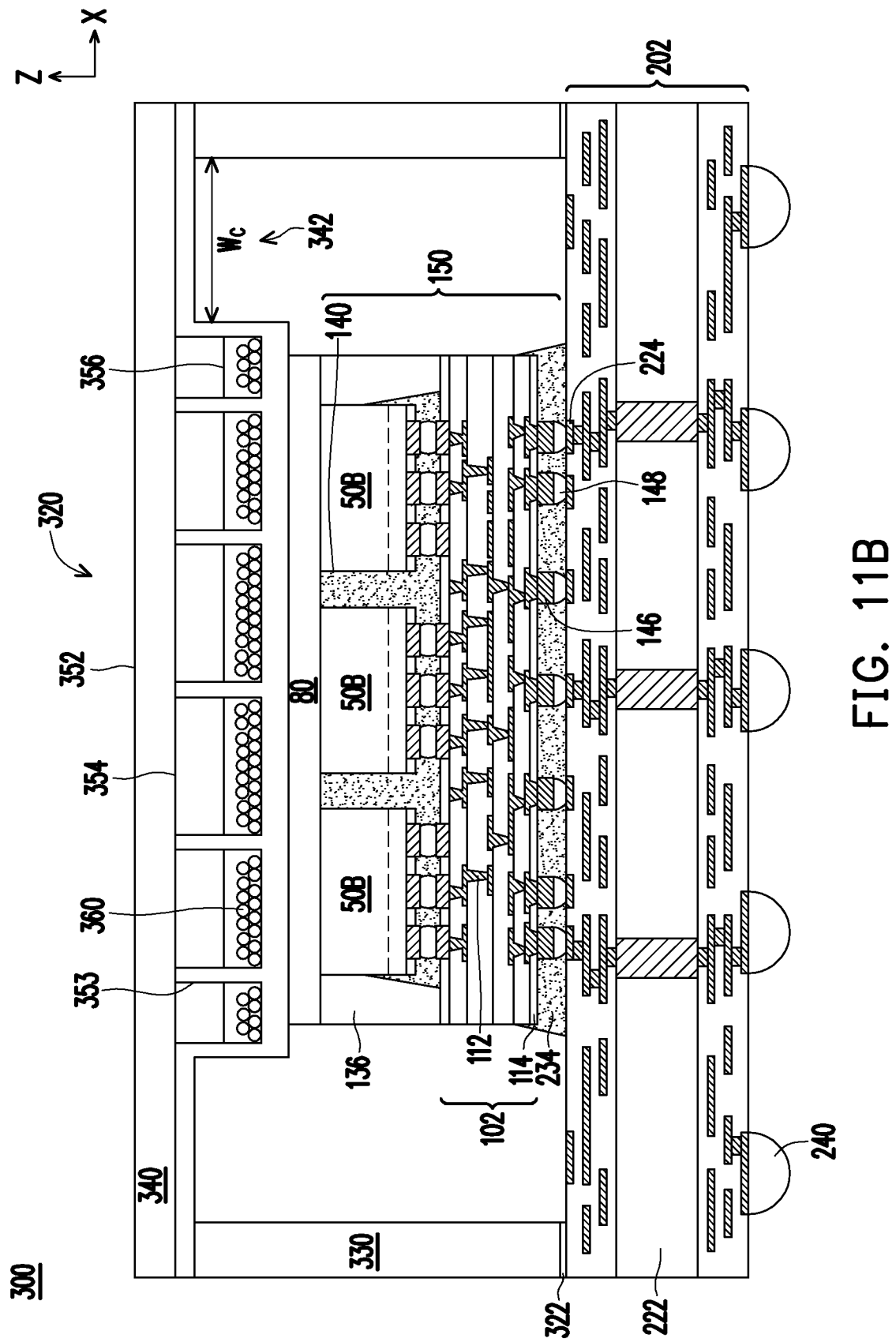
Figure 11C:
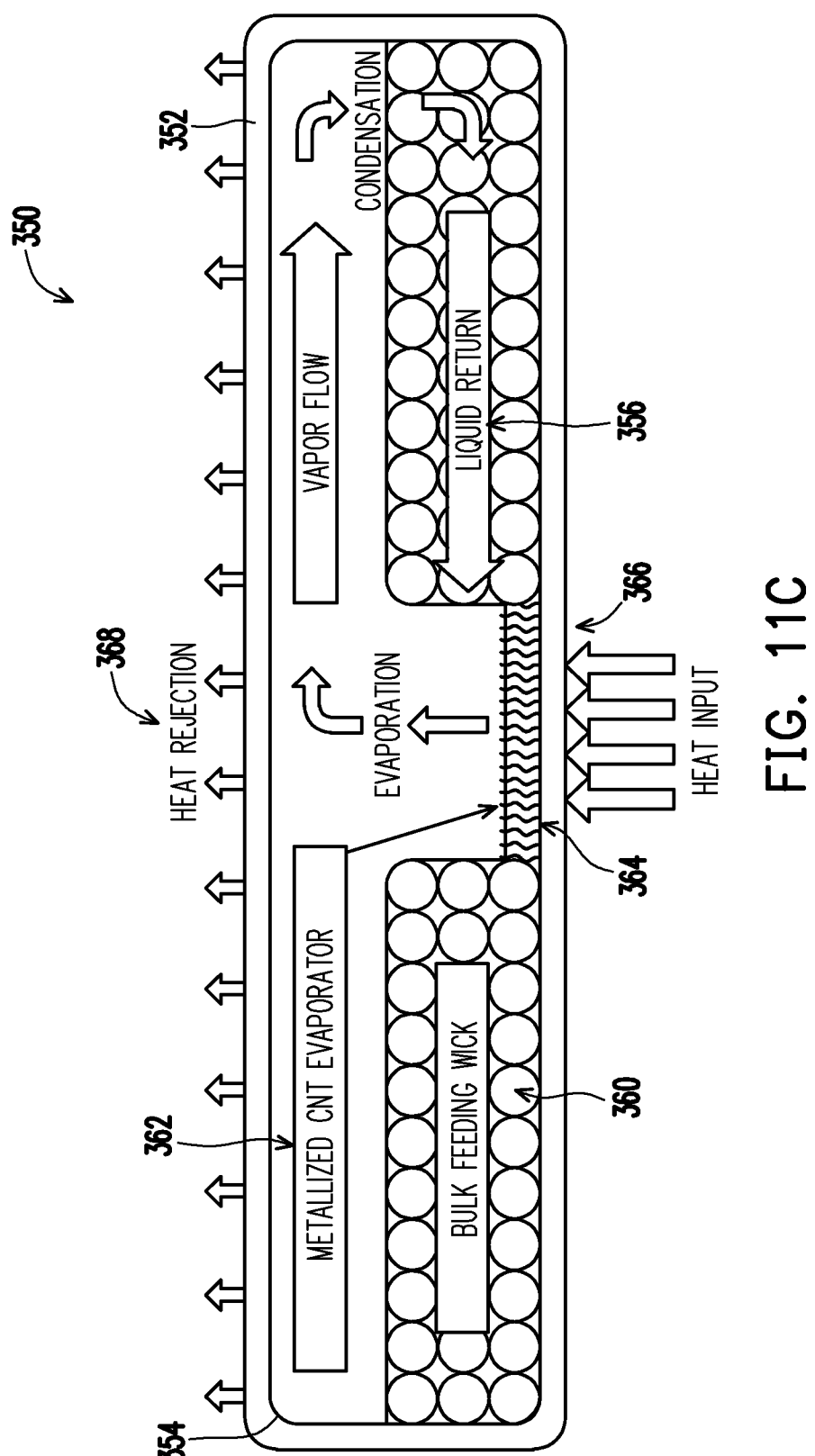

In FIGS. 11A-11C, an integrated circuit package 300 is provided such that the lid cap 340 includes a vapor chamber 350 for enhanced heat dissipation from the integrated circuit dies 50 and the TIM 80. The integrated circuit package 300 may be formed similarly as described above in connection with the integrated circuit package 100, unless otherwise specified. FIG. 11A illustrates a first side view of the integrated circuit package 300 in the Y-Z plane, and FIG. 11B illustrates a second side view of the integrated circuit package 300 in the X-Z plane.

The integrated circuit package 300 may include some or all of the features described above in connection with the integrated circuit packages 100, 200, such as including the lid structure 320 having the discrete lid feet 330 and the lid cap 340. In addition, the lid cap 340 may include the cavity 342 forming a continuous loop around the package component 150.

In accordance with some embodiments, the vapor chamber 350 of the lid cap 340 includes an outer shell 352 that encloses, hermetically seals, and defines a cavity within inner walls of the outer shell 352 providing an internal chamber 354 within the outer shell 352 of the vapor chamber 350. As illustrated, pillars 353 extend from an upper inner surface to a lower inner surface of the internal chamber 354 to provide extra structural support, such as at elevated temperatures. In addition, the pillars 353 may prevent a working fluid (WF) 356 within from boiling and causing damage to the internal chamber 354 or other features contained within. The outer shell 352 and the pillars 353 comprise materials that possess a high thermal conductivity and a low CTE. According to an embodiment, the lid cap 340 (e.g., the outer shell 352 and the pillars 353) comprises a material such as copper, copper alloy, copper tungsten (CuW), or aluminum-silicon-carbide (AlSiC). Other suitable thermally conductive materials and/or thermally insulating materials may also be used. In some embodiments, the lid cap 340 has a low CTE substantially similar to a CTE of the package substrate 202.

As illustrated, in some embodiments, the pillars 353 in the internal chamber 354 may be aligned with the gap regions 140 between adjacent integrated circuit dies 50. As a result, the vapor chamber 350 may be most effective at dissipating heat from regions of the integrated circuit dies 50 that may generate higher amounts of heat, as well as dissipating heat from regions of the TIM 80 that may be holding higher amounts of heat due to being located directly above those regions of the integrated circuit dies 50. Some of the pillars 353 may be aligned with the gap regions 140, and some of the pillars 353 may be misaligned for purposes of maintaining sufficient structural integrity.

The thickness of the outer shell 352 of the vapor chamber 350 depends on several factors including, but not limited to, heat dissipation rate of one or more of the plurality of integrated circuit dies 50, thermal conductivity of the material of the outer shell 352, presence of an external heat sink, the size of the package component 150, and surface areas of the integrated circuit dies 50. According to some embodiments, the outer shell 352 may comprise sheets of thermally conductive material having a substantially uniform thickness. In other embodiments, the outer shell 352 may comprise sheets of thermally conductive material having different thicknesses. However, any suitable form of thermally conductive material and any suitable variants of thicknesses may be utilized.

In some embodiments, the dimensions of the outer shell 352 and the internal chamber 354 may be uniform throughout the vapor chamber 350. For example, the outer shell 352 may have a same height, a same length, and a same depth throughout the vapor chamber 350, and the internal chamber 354 may also have a same height, a same length, and a same depth through the vapor chamber 350. In some embodiments, one or more of these dimensions may be varied throughout the vapor chamber 350.

Referring to FIG. 11C, according to some embodiments, the internal chamber 354 of the vapor chamber 350 is sealed within and may contain an evaporating and condensing liquid such as a two-phase vaporizable liquid which serves as the working fluid 356. The working fluid 356 is a liquid that possesses a relatively high latent heat of vaporization in order to disperse heat away from the package components 150 and the TIM 80. The internal chamber 354 further contains a wick structure 360, such as a bulk feeding wick layer, for receiving the working fluid 356. The wick structure 360 may be housed and sealed within the internal chamber 354 and positioned along inner walls of the internal chamber 354. As illustrated, the wick structure 360 may be positioned along a lower inner wall of the internal chamber 354, wherein the wick structure 360 is disposed proximal to the TIM 80.

Furthermore, the wick structure 360 may comprise an evaporator 362 (e.g., metallized carbon-nanotube (CNT) evaporator) including a plurality of metal wires 364 (e.g., CNT evaporator lines, coils, wires, or conductors) arranged adjacent one another and woven together. The metal wires 364 have a large amount of pores therein which generate capillary force for transferring the working fluid 356. In some embodiments, the plurality of metal wires 364 are each shaped such that first portions of the metal wires 364 come in physical contact with and are thermally coupled to and located along the lower inner surface of the internal chamber 354 in order to be proximal to a heat intake area of the vapor chamber 350. In some embodiments, second portions of the metal wires 364 that interpose adjacent first portions are raised above the lower inner surface of the internal chamber 354. For example, the plurality of metal wires 364 may include a serpentine shape with first portions curving towards the lower inner surface of the internal chamber 354 and interposing second portions curving away from the lower inner surface of the internal chamber 354. In some embodiments, the wick structure 360 includes a porous wick comprising copper mesh and/or copper powder. However, any suitable shape may be used.

FIG. 11C further illustrates a general functional flow of the vapor chamber 350 during operation, in accordance with some embodiments. In particular, the vapor chamber 350 functions to expel heat generated from the integrated circuit dies 50 through the TIM 80 and through one or more areas of thermal contact 366 (e.g., a heat input area) maintained with the TIM 80. In some embodiments, the vapor chamber 350 may also expel heat generated from the package substrate 202 through one or more other areas of thermal contact 366 maintained with the lid feet 330 of the lid structure 320. While the vapor chamber 350 accumulates, transfers, and expels heat away from the package component 150, the working fluid 356 contained in the wick structure 360 is heated and vaporizes. The vapor of the working fluid 356 then spreads to fill the internal chamber 354. Wherever the vapor comes into contact with an upper inner surface of the internal chamber 354 that is cooler than the working fluid's 356 latent heat of vaporization, heat is expelled through the cooler surfaces of thermal contact 368 (e.g., a heat rejection area) of the vapor chamber 350, and the vapor condenses back to its liquid form of the working fluid 356. Once condensed, the working fluid 356 reflows to the areas of thermal contact 366 via a capillary force generated by the wick structure 360. Thereafter, the working fluid 356 frequently vaporizes and condenses to form a circulation to expel the heat generated by the integrated circuit dies 50 of the package component 150 and/or the package substrate 202. This arrangement effectively spreads thermal energy across the vapor chamber 350 of the lid structure 320 so that the generated heat may be drawn off via the thermal contact 366 (e.g., the heat input area) and dissipated via the thermal contact 368 (e.g., the heat rejection area) to the surrounding environment in a highly efficient manner.

Figure 12A:
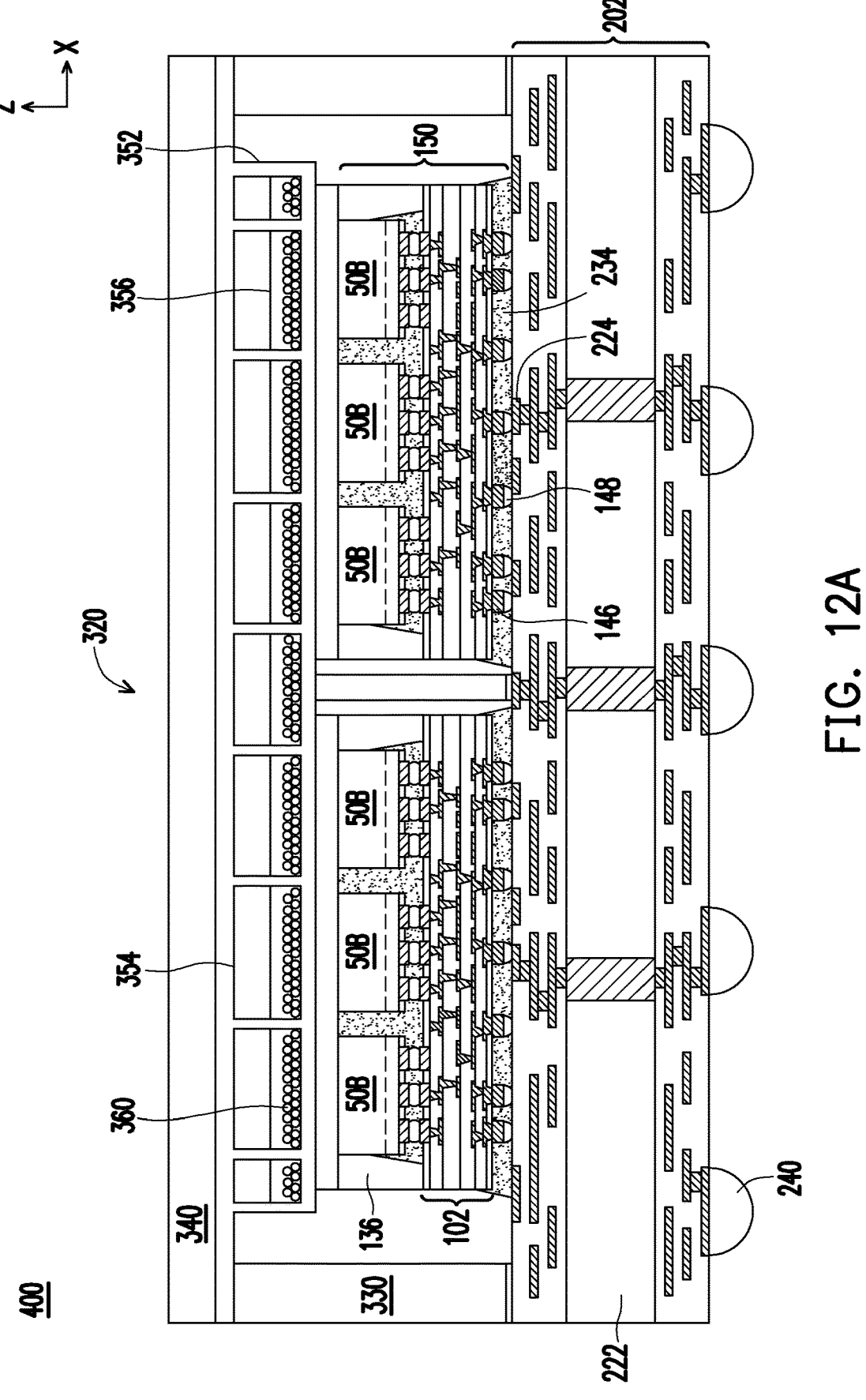
FIGS. 12A-12B are views of intermediate stages in the manufacturing of integrated circuit packages, in accordance with some embodiments.
Figure 12B:
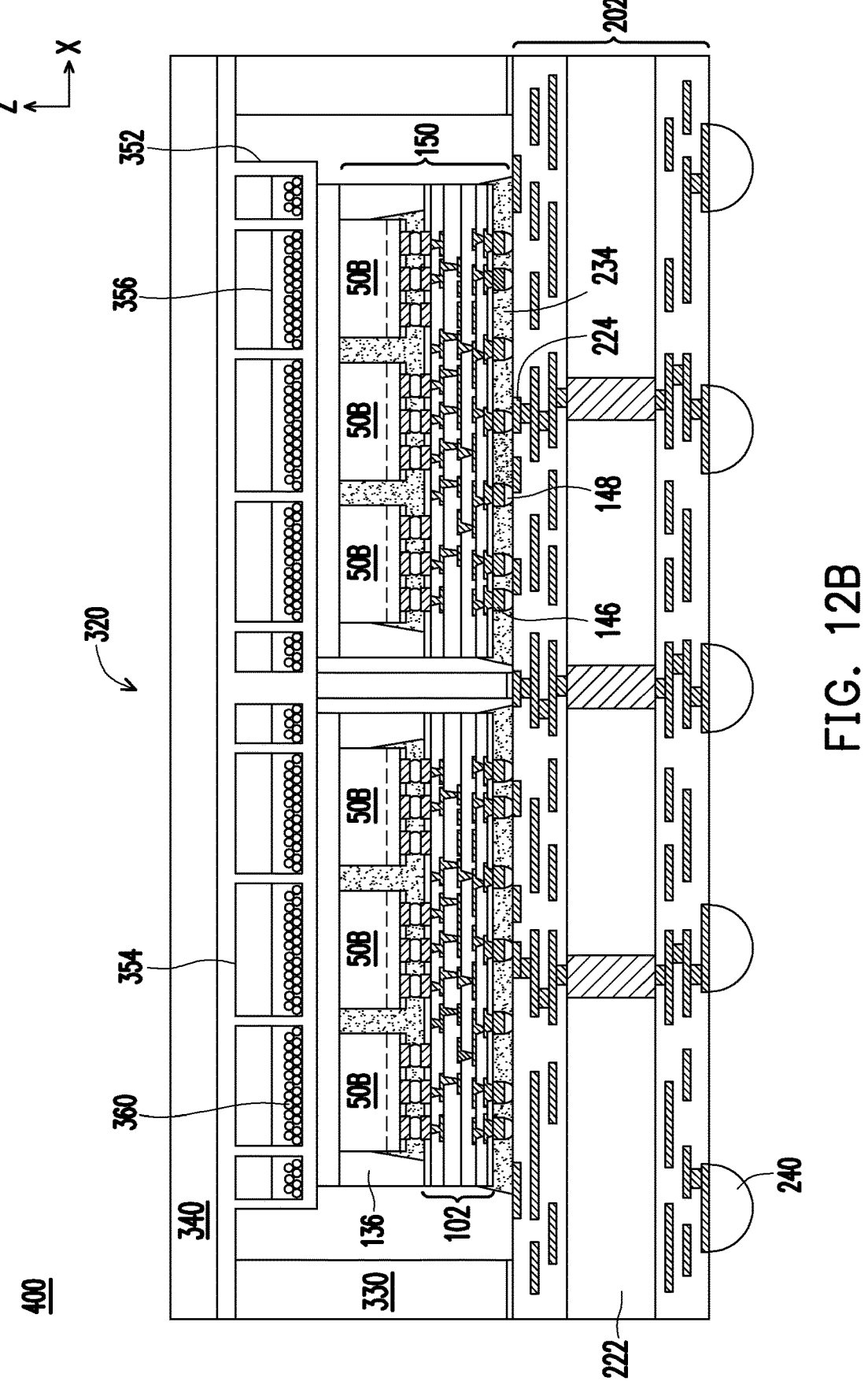

In FIGS. 12A-12B, various embodiments of an integrated circuit package 400 are provided such that multiple package components 150 and multiple TIMs 80 are attached and enclosed within a single lid structure 320 which includes one or more vapor chambers 350. The integrated circuit package 400 may be formed similarly as described above in connection with the integrated circuit packages 200, 300, unless otherwise specified. FIGS. 12A and 12B illustrate side views of exemplary embodiments of the integrated circuit package 400 in the X-Z plane.

The integrated circuit package 400 may include some or all of the features described above in connection with the integrated circuit packages 200, 300 such as including the lid structure 320 having the discrete lid feet 330 and the lid cap 340. In addition, the lid cap 340 may include the cavity 342 forming a continuous loop around all of the package components 150 and one or more protrusions 344 descending from the lid cap 340 to the package substrate 202 between adjacent package components 150. Further, the underfill 234 is formed in discrete portions below each of the package components 150.

Referring to FIG. 12A, the lid structure 320 may include the vapor chamber 350 disposed over the multiple package components 150 and the multiple TIMs 80. In particular, the lid cap 340 of the lid structure 320 may house a single vapor chamber 350 (e.g., comprising a single internal chamber 354) corresponding to the two or more package components 150 in the integrated circuit package 400. As a result, the vapor chamber 350 may effectively dissipate heat from the integrated circuit dies 50 even when some of the package components 150 may be generating higher amounts of heat and others of the package components 150 may be generating lesser amounts of heat.

Referring to FIG. 12B, the lid structure 320 may include multiple vapor chambers 350 disposed over the multiple package components 150 and the multiple TIMs 80. In particular, the lid cap 340 of the lid structure 320 may house a vapor chamber 350 (e.g., comprising a single internal chamber 354) corresponding to each underlying package component 150 in the integrated circuit package 400. The lid cap 340 having distinct vapor chambers 350 for the package components 150 allows each of the vapor chambers 350 to be customized for functionality associated with their corresponding package components 150. As such, the multiple package components 150 (e.g., two package components 150) includes a higher heat generating package component 150 and a lower heat generating package component 150, the vapor chamber 350 corresponding to the higher heat generating package component 150 may be configured to dissipate a greater amount of heat than the vapor chamber 350 corresponding to the lower heat generating package component 150.

Note that any combination of these features and other features described above may be substituted or incorporated into the lid structure 320. For example, the embodiments depicted in connection with FIGS. 12A and 12B may include any of the previously described features, such as those relating to the lid feet 330 (and the grooves 332, if present), the corner lid feet 330C (if present), and the protrusion 344 (and the protrusion grooves 346, if present).

Embodiments may achieve advantages. In particular, embodiments of the lid structure 320 described above include various features and designs for structural flexibility to maintain physical and thermal contact with the TIMs 80 and, therefore, improve heat dissipation from the integrated circuit dies 50 while reducing stresses in an integrated circuit package. These features become particularly advantageous when the integrated circuit package experiences warpage during various processes. In addition, the lid structure 320 maintains structural integrity and rigidity due to various features and designs that minimize warpage of the integrated circuit package during those various processes. As discussed above, the various processes may include thermal sub-processes, including attachment of the package component 150 to the package substrate 202 and attachment of the lid structure 320 to the package substrate 202 and the package component 150. Further, subsequent packaging and testing (e.g., thermal cycle testing) may also tend to cause warpage in the integrated circuit package, which the embodiments discussed herein serve to address to improve yield and performance of the integrated circuit package.

In an embodiment, a method includes: attaching a package component to a package substrate, the package component includes: a first die being disposed over an interposer; a second die being disposed over the interposer and laterally adjacent to the first die; and an encapsulant being disposed around the first die and the second die; attaching a thermal interface material to the first die and the second die; and attaching a lid structure to the package substrate, the lid structure includes: a lid cap being disposed over the thermal interface material; and a plurality of lid feet connecting the lid cap to the package substrate, in a plan view the plurality of lid feet forming a discontinuous loop around the package component. In another embodiment, the plurality of lid feet includes a first foot and a second foot disposed proximal to the first die and the second die, and wherein a groove between the first foot and the second foot is aligned with a gap region between the first die and the second die. In another embodiment, the plurality of lid feet includes corner lid feet, and wherein each of the corner lid feet has an L-shape. In another embodiment, the method further includes an underfill being disposed between the interposer and the package substrate, wherein the underfill is at least 3 mm from each of the corner lid feet. In another embodiment, the method further includes, before attaching the lid structure to the package substrate, attaching an additional package component to the package substrate. In another embodiment, the lid structure further includes a protrusion extending from the lid cap, and wherein the protrusion is disposed between the package component and the additional package component. In another embodiment, the protrusion includes a first protrusion foot and a second protrusion foot, and wherein a groove between the first protrusion foot and the second protrusion foot is aligned with a gap region between the first die and the second die. In another embodiment, the lid cap includes a cavity forming a loop around the package component.

In an embodiment, a semiconductor package includes: a first package component being attached to a package substrate, the first package component includes: a first die being disposed over the package substrate; and a second die being disposed over the package substrate, opposing first sidewalls of the first die and the second die being separated by a gap region; a thermal interface material being attached to the first package component; and a lid structure being attached to the package substrate, the lid structure includes: a first foot being disposed adjacent to the first die; a second foot being disposed adjacent to the second die, opposing second sidewalls of the first foot and the second foot being separated by a groove; and a lid cap connecting the thermal interface material, the first foot, and the second foot. In another embodiment, in a plan view the gap region is aligned with the groove. In another embodiment, the semiconductor package further includes a second package component attached to the package substrate, the second package component includes: a system-on-a-chip die being disposed over the package substrate; and a memory die being disposed over the package substrate. In another embodiment, the lid structure further includes a protrusion being disposed between the first package component and the second package component. In another embodiment, the protrusion extends from the lid cap and is attached to the package substrate. In another embodiment, the lid cap includes a vapor chamber, and wherein the vapor chamber includes: an outer shell comprising a chamber within; a pillar extending from a floor to a ceiling of the chamber; and a wick structure being disposed adjacent to the floor. In another embodiment, the pillar is aligned with the gap region.

In an embodiment, a semiconductor package includes: a package component being attached to a package substrate, the package component includes a plurality of dies, the plurality of dies being separated from one another by gap regions; and a lid structure being attached to the package substrate, the lid structure includes: a plurality of lid feet being attached to the package substrate, the plurality of lid feet being separated from one another by grooves, wherein each of the gap regions is aligned with at least one of the grooves; and a lid cap disposed over the package component and attached to the plurality of lid feet. In another embodiment, the plurality of lid feet includes corner lid feet, wherein in a plan view the corner lid feet are located at corners of the semiconductor package; and wherein each of the corner lid feet has an L-shape. In another embodiment, the semiconductor package further includes a thermal interface material disposed between the package component and the lid cap. In another embodiment, the lid cap includes a vapor chamber. In another embodiment, the semiconductor package further includes: an additional package component being attached to the package substrate; and an additional thermal interface material being disposed between the additional package component and the lid cap, wherein the lid structure further includes a plurality of protrusions disposed between the package component and the additional package component, wherein the plurality of protrusions are separated from one another by protrusion grooves, and wherein each of the protrusion grooves is aligned with at least one of the gap regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching a first package component to a package substrate, the first package component comprising:
        a first die being disposed over an interposer;
        a second die being disposed over the interposer and laterally adjacent to the first die; and
        an encapsulant being disposed around the first die and the second die;
    attaching a second package component to the package substrate;
    attaching a thermal interface material to the first die and the second die; and
    attaching a lid structure to the package substrate, the lid structure comprising:
        a lid cap being disposed over the thermal interface material, the lid cap comprising a cavity forming a loop, wherein in a plan view the loop is around the first package component and the second package component; and
        a plurality of lid feet connecting the lid cap to the package substrate, in a plan view the plurality of lid feet forming a discontinuous loop around the first package component and the second package component.

2. The method of claim 1, wherein the plurality of lid feet comprises a first foot and a second foot disposed proximal to the first die and the second die, and wherein a groove between the first foot and the second foot is aligned with a gap region between the first die and the second die.

3. The method of claim 1, wherein the plurality of lid feet comprises corner lid feet, and wherein each of the corner lid feet has an L-shape.

4. The method of claim 3, further comprising an underfill being disposed between the interposer and the package substrate, wherein the underfill is at least 3 mm from each of the corner lid feet.

5. The method of claim 1, wherein the lid structure further comprises a protrusion extending from the lid cap, and wherein the protrusion is disposed between the first package component and the second package component.

6. The method of claim 5, wherein the protrusion comprises a first protrusion foot and a second protrusion foot, and wherein a groove between the first protrusion foot and the second protrusion foot is aligned with a gap region between the first die and the second die.

7. A method comprising:
    forming a first package component, the first package component comprising a first plurality of dies attached over a first interposer;
    bonding the first package component to a package substrate, the package substrate comprising:
        a substrate core;
        redistribution structures on opposite sides of the substrate core; and
        through vias extending through the substrate core and coupling the redistribution structures to one another;
    bonding a second package component to the package substrate, the second package component comprising a second plurality of dies attached over a second interposer;
    attaching a lid structure over the first package component and to a first surface of the package substrate, the lid structure comprising:
        a plurality of lid feet adjacent a perimeter of the package substrate; and
        a lid cap over and connecting the plurality of lid feet.

8. The method of claim 7, further comprising forming the second package component.

9. The method of claim 8, wherein the first package component and the second package component are laterally displaced from one another along the first surface of the package substrate.

10. The method of claim 9, wherein the lid structure comprises an additional foot interposed between the first package component and the second package component.

11. The method of claim 9, wherein the lid structure comprises an additional plurality of feet interposed between the first package component and the second package component.

12. The method of claim 7, further comprising, before attaching the lid structure, attaching a thermal interface material over the first package component.

13. A method comprising:
    bonding a first die and a second die to a first interposer to form a first package component, a first gap region separating the first die from the second die;
    attaching the first package component to a package substrate using solder regions;
    dispensing an underfill material around the solder regions;
    attaching a thermal interface material over the first package component;
    attaching a lid structure to the package substrate and over the thermal interface material, attaching the lid structure comprising:
        adhering a first lid foot and a second lid foot of the lid structure to an outer region of the package substrate using an adhesive material, a second gap region separating the first lid foot from the second lid foot, wherein the second gap region is aligned with the first gap region; and
        placing a lid cap of the lid structure in contact with the thermal interface material.

14. The method of claim 13, further comprising attaching a second package component to the package substrate, wherein the lid structure is attached over the second package component, and wherein a third gap region separates the first package component from the second package component.

15. The method of claim 14, further comprising adhering a third lid foot to the package substrate within the third gap region.

16. The method of claim 13, wherein the thermal interface material is in contact with the first die and the second die.

17. The method of claim 16, wherein placing the lid cap of the lid structure in contact with the thermal interface material is performed after adhering the first lid foot and the second lid foot of the lid structure to the package substrate.

18. The method of claim 13, wherein the lid cap comprises a vapor chamber.

19. The method of claim 18, wherein the vapor chamber comprises:

an internal chamber;

a working fluid inside of the internal chamber; and a wick structure inside of the internal chamber and configured for the working fluid to pass through.

20. The method of claim 7, wherein the lid structure comprises a cavity located where the lid cap and the lid feet meet, and wherein the cavity forms a continuous loop.

* * * * *